United States Patent
Kang et al.

(10) Patent No.: US 7,804,137 B2
(45) Date of Patent: Sep. 28, 2010

(54) FIELD EFFECT TRANSISTOR (FET) DEVICES AND METHODS OF MANUFACTURING FET DEVICES

(75) Inventors: Hee-soo Kang, Anyang-si (KR); Dong-gun Park, Seongnam-si (KR); Choong-ho Lee, Seongnam-si (KR); Hye-Jin Cho, Seongnam-si (KR); Young-Joon Ahn, Daejeon Metropolitan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 11/930,265

(22) Filed: Oct. 31, 2007

(65) Prior Publication Data

US 2008/0061371 A1 Mar. 13, 2008

Related U.S. Application Data

(62) Division of application No. 11/080,731, filed on Mar. 16, 2005, now Pat. No. 7,329,581.

(30) Foreign Application Priority Data

May 17, 2004 (KR) .......................... 2004-0034903

(51) Int. Cl.
*H01L 23/62* (2006.01)
(52) U.S. Cl. ..................................... 257/369; 257/385
(58) Field of Classification Search ................. 257/369, 257/385
See application file for complete search history.

(56) References Cited

U.S. PATENT DOCUMENTS

| | | | |
|---|---|---|---|
| 4,637,127 A | 1/1987 | Kurogi et al. |
| 5,041,884 A | 8/1991 | Kumamoto et al. |
| 5,452,247 A | 9/1995 | Takao |
| 6,022,766 A | 2/2000 | Chen et al. |
| 6,184,083 B1 | 2/2001 | Tsunashima et al. |
| 6,396,108 B1 | 5/2002 | Krivokapic et al. |
| 6,413,802 B1 | 7/2002 | Hu et al. |
| 6,429,484 B1 | 8/2002 | Yu |
| 6,642,090 B1 | 11/2003 | Fried et al. |
| 6,657,259 B2 | 12/2003 | Fried et al. |
| 6,660,596 B2 | 12/2003 | Adkisson et al. |
| 6,686,231 B1 | 2/2004 | Ahmed et al. |

(Continued)

FOREIGN PATENT DOCUMENTS

DE 4336866 5/1994

(Continued)

*Primary Examiner*—Richard A. Booth
(74) *Attorney, Agent, or Firm*—Volentine & Whitt, PLLC

(57) ABSTRACT

In one aspect, a semiconductor substrate is provided having a cell area and a peripheral circuit area, and a mask layer is formed over the cell area and the peripheral circuit area of the semiconductor substrate. A FinFET gate is fabricated by forming a first opening in the mask layer to expose a first gate region in the cell area of the semiconductor substrate, and then forming a FinFET gate electrode in the first opening using a damascene process. A MOSFET gate fabricated by forming a second opening in the mask layer to expose a second gate region in the peripheral circuit area of the semiconductor substrate, and then forming a MOSFET gate electrode in the second opening using a damascene process.

16 Claims, 21 Drawing Sheets

U.S. PATENT DOCUMENTS

| | | |
|---|---|---|
| 6,911,383 B2 | 6/2005 | Doris et al. |
| 7,329,581 B2 * | 2/2008 | Kang et al. ................ 438/275 |
| 2003/0102518 A1 | 6/2003 | Fried et al. |
| 2004/0065884 A1 | 4/2004 | Bhattacharyya |
| 2008/0023728 A1 | 1/2008 | Jang et al. |

FOREIGN PATENT DOCUMENTS

| | | |
|---|---|---|
| DE | 102005000997 A1 | 8/2005 |
| EP | 1383166 A2 | 1/2004 |
| JP | 2000-114453 | 4/2000 |

* cited by examiner

FIELD EFFECT TRANSISTOR (FET) DEVICES AND METHODS OF MANUFACTURING FET DEVICES

CROSS-REFERENCE TO RELATED APPLICATIONS

This is a Divisional of U.S. non-provisional application Ser. No. 11/080,731, filed Mar. 16, 2005, which is incorporated herein by reference in its entirety.

BACKGROUND OF THE INVENTION

1. Field of the Invention

The present invention generally relates to semiconductor devices and methods of manufacturing semiconductor devices, and more particularly, the present invention relates field effect transistor (FET) devices and to methods of manufacturing FET devices.

2. Description of the Related Art

In response to the continuing decrease in scale of semiconductor devices, reliable alternatives to convention MOSFET devices are being sought. One such alternative is FinFET devices which are known to exhibit reduced leakage current and high drive current. However, problems in fabrication have made it difficult to implement FinFET devices in memory chips. In particular, doping of the tri-gate FinFET structure is especially problematic. This is at least partly because vertical angle implantation doping results in depletion of a side portion of the gate in the FinFET structure. This and other manufacturing problems have placed limitations on the implementation of FinFET based memory devices.

SUMMARY OF THE INVENTION

According to one aspect of the present invention, a method of fabricating a semiconductor device is provided which includes providing a semiconductor substrate having a cell area and a peripheral circuit area, forming a mask layer over the cell area and the peripheral circuit area of the semiconductor substrate, forming a FinFET gate by forming a first opening in the mask layer to expose a first gate region in the cell area of the semiconductor substrate and forming a FinFET gate electrode in the first opening using a damascene process, forming a MOSFET gate by forming a second opening in the mask layer to expose a second gate region in the peripheral circuit area of the semiconductor substrate, and forming a MOSFET gate electrode in the second opening using a damascene process.

According to another aspect of the present invention, a method of fabricating a semiconductor device is provided which includes forming a FinFET gate electrode of a first material over a cell area of a semiconductor substrate using a damascene process, and forming a MOSFET gate of a second material over a peripheral circuit area of the semiconductor substrate using a damascene process.

According to yet another aspect of the present invention, a semiconductor device is provided which includes a semiconductor substrate, a first FET device of a first conductivity located over the semiconductor substrate and having a first gate electrode extending over a top surface and opposite side surfaces of a first active region, an insulating layer formed over the first FET device, and a second FET device of a second conductivity located over the insulating layer and having second gate electrode extending over a top surface and opposite side surfaces of a second active region.

According to still another aspect of the present invention, a method of fabricating a semiconductor device is provided which includes forming a first FET device of a first conductivity over a semiconductor substrate, the first FET device having a first gate electrode extending over a top surface and opposite side surfaces of a first active region, forming an insulating layer over the first FET device, and forming a second FET device of a second conductivity over the insulating layer and having second gate electrode extending over a top surface and opposite side surfaces of a second active region.

According to another aspect of the present invention, a method of fabricating a semiconductor device is provided which includes providing a semiconductor substrate having a cell area and a peripheral circuit area, forming a mask layer over the cell area and the peripheral circuit area of the semiconductor substrate, forming a first FinFET gate by forming a first opening in the mask layer to expose a first gate region in the cell area of the semiconductor substrate and forming a FinFET gate electrode in the first opening using a damascene process, forming a MOSFET gate by forming a second opening in the mask layer to expose a second gate region in the peripheral circuit area of the semiconductor substrate and forming a MOSFET gate electrode in the second opening using a damascene process, forming first source and drain regions adjacent the first FinFET gate to define a first FinFET, forming second source and drain regions adjacent the MOSFET gate to define a MOSFET, forming an insulating layer over the first FinFET and the MOSFET, and forming a second FinFET having a second FinFET gate over the insulating layer and stacked over the first FinFET device.

According to still another aspect of the present invention, a method of fabricating a semiconductor device is provided which includes forming a first FinFET gate electrode of a first material over a cell area of a semiconductor substrate using a damascene process, forming a MOSFET gate electrode of a second material over a peripheral circuit area of the semiconductor substrate using a damascene process, and forming a second FinFET gate electrode of a third material stacked over the first FinFET gate electrode with an insulating layer interposed there between.

According to yet another aspect of the present invention, a semiconductor device is provided which includes a semiconductor substrate having a cell area and a peripheral circuit area, a first FET device of a first conductivity located in the cell area over the semiconductor substrate and having a first gate electrode extending over a top surface and opposite side surfaces of a first active region, a MOSFET device located over the peripheral circuit area and having a second gate electrode, an insulating layer formed over the first FET device and the MOSFET device, and a second FET device of a second conductivity located over the insulating layer and stacked over the first FET device, the second FET device having second gate electrode extending over a top surface and opposite side surfaces of a second active region.

BRIEF DESCRIPTION OF THE DRAWINGS

The above and other aspects and features of the present invention will become readily apparent from the detailed description that follows, with reference to the accompanying drawings, in which:

FIGS. 2A through 10B are cell area and peripheral circuit area cross-sectional views for explaining a method of fabricating a semiconductor device of FIG. 1, where FIGS. 2A, 3A, 4A, 5A, 6A, 7A, 8A, 9A, and 10A are cross-sectional views taken along the row (X) direction (line a-a') of FIG. 1, and FIGS. 2B, 3B, 4B, 5B, 6B, 7B, 8B, 9B, and 10B are cross-sectional views taken along the column (Y) direction (line b-b') of FIG. 1;

DETAILED DESCRIPTION OF PREFERRED EMBODIMENTS

Figure 1:
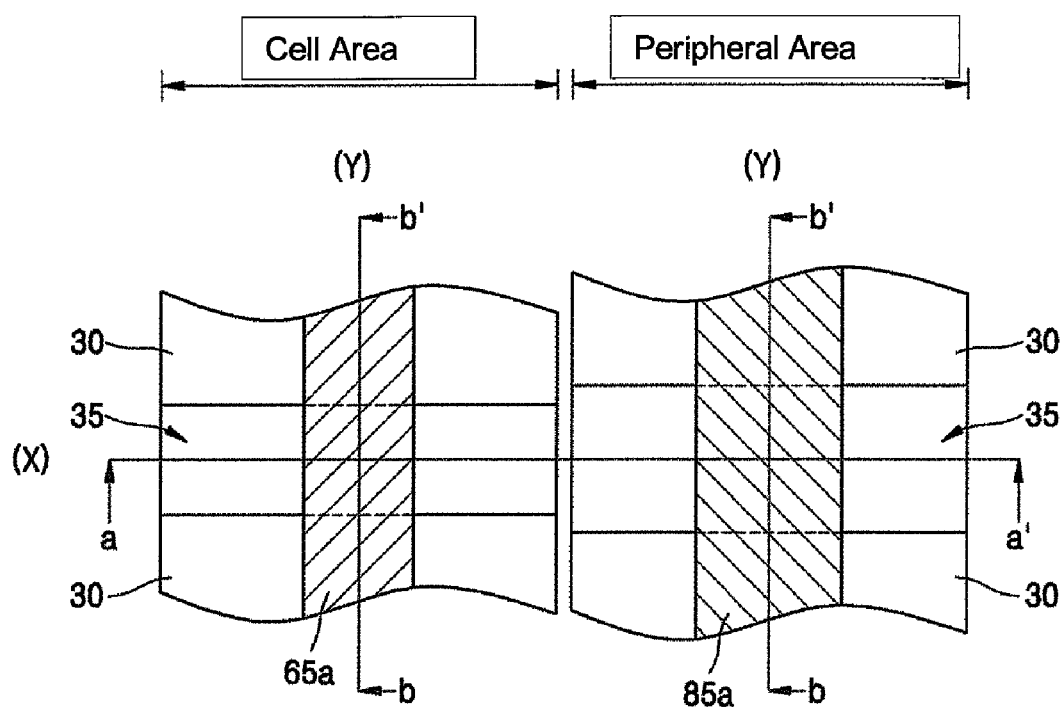
FIG. 1 illustrates a top-view layout of a semiconductor device according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concepts of the invention to those skilled in the art. In the drawings, like reference numerals denote like elements.

FIG. 1 illustrates a top-view layout of a semiconductor device according to embodiments of the present invention. The semiconductor device contains a cell area and a peripheral circuit area as shown. Also, for purposes of explanation, a row (X) direction extends side-to-side in the figure, and a column (Y) direction extends up-and-down in the figure.

The semiconductor device of this example includes a FinFET in the cell area and a MOSFET in the peripheral circuit area. That is, referring to FIG. 1, an active region 35 extends lengthwise in the row (X) direction in the cell and peripheral circuit areas and is defined by an isolation layer 30. A FinFET gate electrode 65a extends lengthwise in the column (Y) direction over the isolation layer 30 and the active region 35 in the cell area. FinFET source/drain regions (not shown) are formed in the active region 35 at opposite sides of the FinFET gate electrode 65a. A MOSFET gate electrode 85a extends lengthwise in the column (Y) direction over the isolation layer 30 and the active region 35 in the peripheral circuit area. MOSFET source/drain regions (not shown) are formed in the active region 35 adjacent opposite sides the MOSFET gate electrode 85a.

FIGS. 2A through 10B are cell area and peripheral circuit area cross-sectional views for explaining a method of fabricating the semiconductor device of FIG. 1. FIGS. 2A, 3A, 4A, 5A, 6A, 7A, 8A, 9A, and 10A are cross-sectional views taken along the row (X) direction (line a-a') of FIG. 1, and FIGS. 2B, 3B, 4B, 5B, 6B, 7B, 8B, 9B, and 10B are cross-sectional views taken along the column (Y) direction (line b-b') of FIG. 1.

Figure 2A:
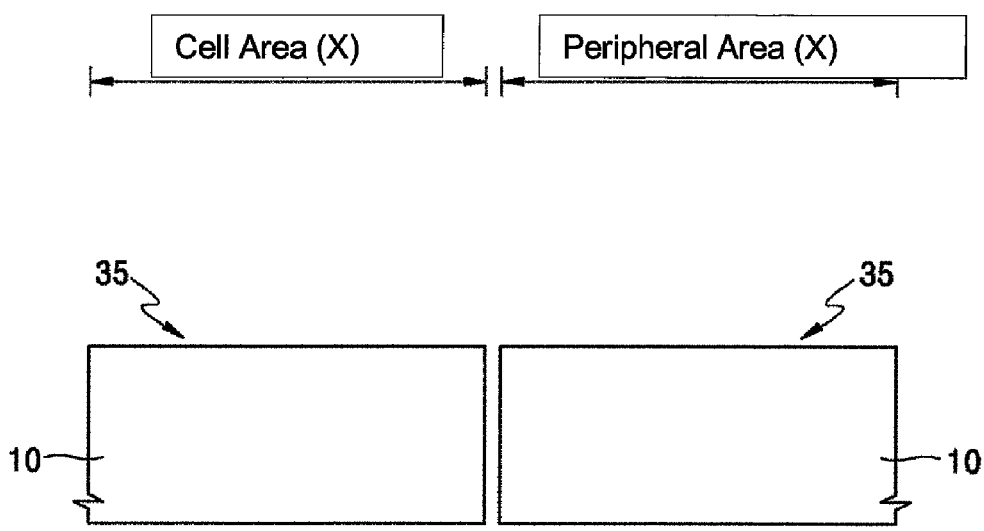
Figure 2B:
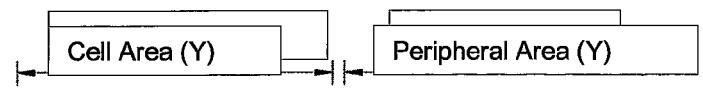
Figure 2B:
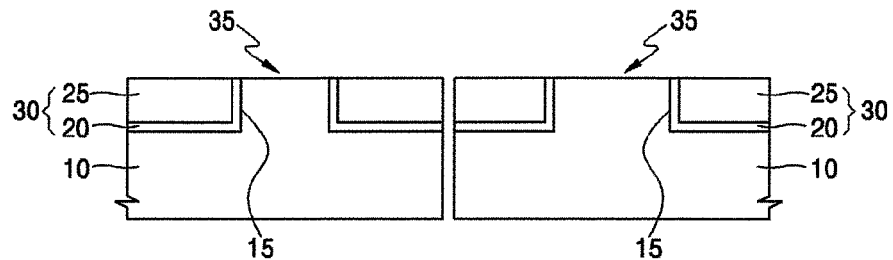

Referring to FIGS. 2A and 2B, the isolation layer 30 is formed in a semiconductor substrate 10, for example, in a bulk silicon substrate. The active region 35 is defined by a portion of the surface area of the substrate 10 that does not contain the isolation layer 30.

The isolation layer 30 may, for example, be formed as a trench isolation layer. In this case, a portion of the semiconductor substrate 10 is etched, thereby forming a trench 15. A dry etch using a mixture of halogen gas, such as HBr or Cl.sub.2, and oxygen may be used to etch the semiconductor substrate 10. Next, an insulating layer liner 20 is optionally formed on an inner wall of the trench 15. The liner 20 may be formed, for example, by thermal oxidation of a silicon oxide layer. Alternately, for example, the liner 20 may be a silicon nitride layer, or a stack of silicon oxide and silicon nitride layers. The liner 20 functions to compensate for any damage that may have occurred during etching of the semiconductor substrate 10 to form the trench 15, and to minimize stresses between the trench 15 and an oxide layer that is used to fill the trench 15. Next, a gap fill oxide layer 25 is deposited, for example, by high density plasma-chemical vapor deposition (HDP-CVD), to fill the trench 15. Subsequently, the portion of the gap fill oxide layer 25 and the insulating layer liner 20 formed on a top surface of the semiconductor substrate 10 are removed to thereby define the isolation layer 30 in the semiconductor substrate 10.

Figure 3A:
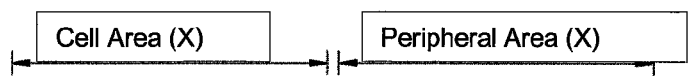
Figure 3A:
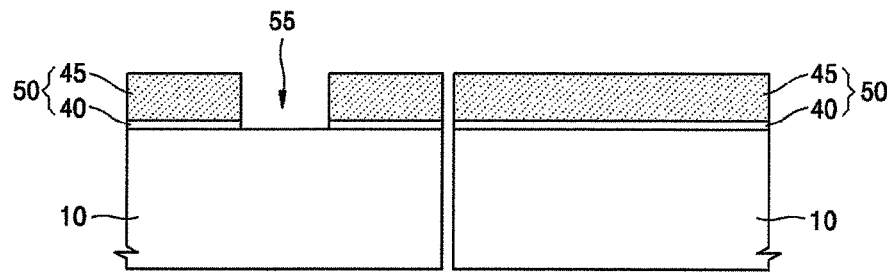
Figure 3B:
Figure 3B:
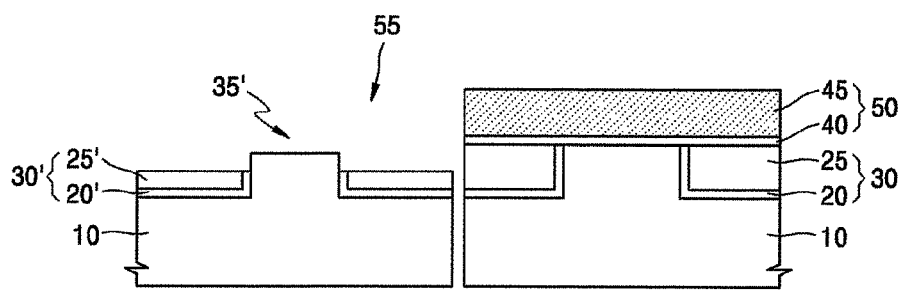

Referring to FIGS. 3A and 3B, a mask layer 50 is formed on the semiconductor substrate 10. In this example, the mask layer 50 is formed of a stack of a mask oxide layer 40 and a mask nitride layer 45. The mask oxide layer 40 may be formed by thermal oxidation, and the mask nitride layer 45 may be formed by low-pressure CVD (LPCVD). A thickness of the mask layer 50 is dependent upon the desired height of a later-formed FinFET gate electrode.

Next, the mask layer 50 in the cell area is etched to define a FinFET gate forming region 55. The mask layer 50 in the peripheral circuit area is not etched. The exposed portion of the isolation layer 30 in the FinFET gate forming region 55 is then etched to a predetermined thickness such that the upper surface of active region 35 is higher than the upper surface of the etched isolation layer 30'. In this manner, a fin 35' is formed. A dry etch or a wet etch may be used to etch the insulating layer liner 20 and the gap fill oxide layer 25 of the isolation layer 30.

Figure 4A:
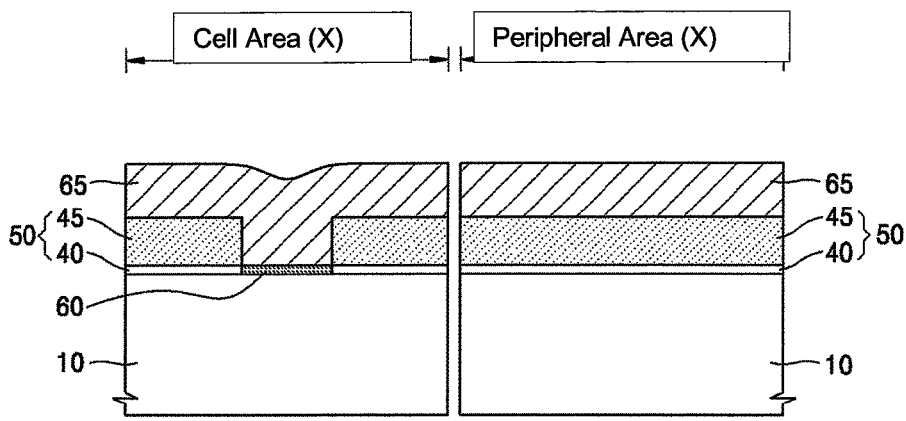
Figure 4B:
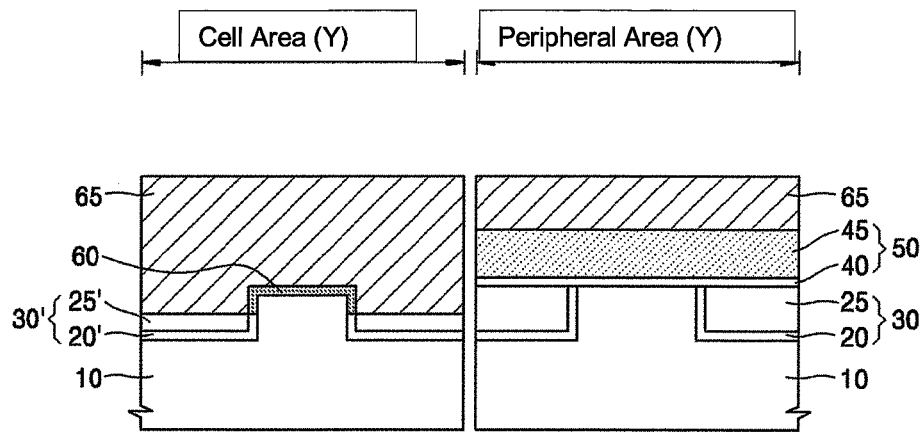

Referring to FIGS. 4A and 4B, a FinFET gate oxide layer 60 is formed on a surface of the semiconductor substrate 10 within the exposed FinFET gate forming region 55 (FIG. 3A). That is, the FinFET gate oxide layer 60 is formed on the surface of the fin 35' (FIG. 3B). The FinFET gate oxide layer 60 may, for example, be formed by thermal oxidation to grow a silicon oxide layer. Next, a FinFET gate conductive layer 65 is formed on a surface of the mask layer 50, thereby filling the FinFET gate forming region 55 (FIG. 3A). The FinFET gate conductive layer 65 may be formed, for example, by depositing an undoped polysilicon layer and then doping the undoped polysilicon layer to obtain a conductive layer. However, the step difference caused by the fin 35' may make it difficult to achieve uniform doping characteristics. Accordingly, it is preferable to form the FinFET gate conductive layer 65 of an in-situ doped polysilicon layer, such as an in-situ n+ doped polysilicon layer. Alternatively, as another example, the FinFET gate conductive layer 65 may be formed of SiGe.

Figure 5A:
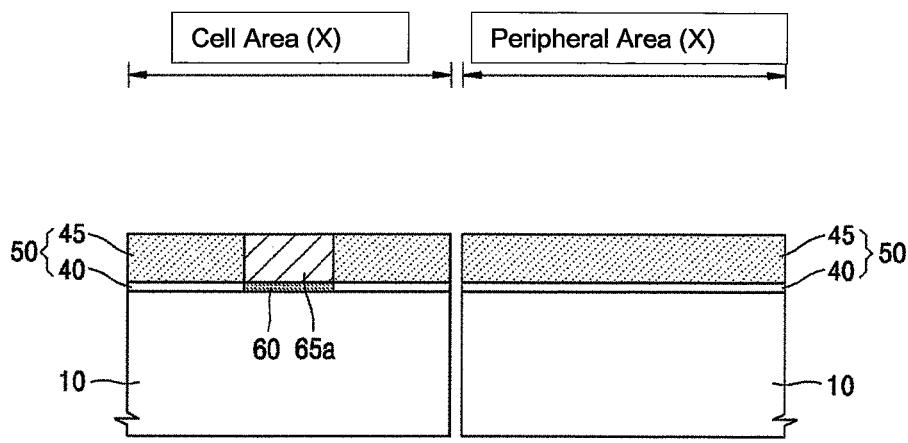
Figure 5B:
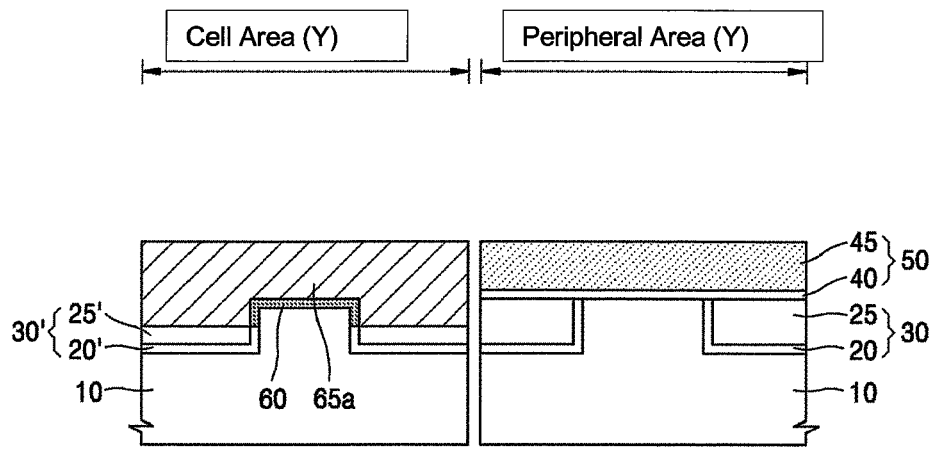

Referring to FIGS. 5A and 5B, the FinFET gate conductive layer 65 is planarized until a top surface of the mask layer 50 is exposed. In this manner, a FinFET gate electrode 65a is formed in a damascene pattern within the FinFET gate forming region 55 (FIG. 3A). As such, the FinFET gate electrode 65a having a flat top surface is formed on a surface of the FinFET gate oxide layer 60 to surround the fin 35'. Chemical mechanical polishing (CMP) may be used to planarize the FinFET gate conductive layer 65.

It is noted here that conventional methods of forming a FinFET encounter problems related to the step difference in the gate conductive layer resulting from the presence of the fin. In particular, exposure and etching of the gate conductive layer to form the gate electrode are problematic. This is because the gate oxide layer is used as a final etch stop layer when the gate electrode is formed by etching the gate conductive layer. Due of the step difference in the gate conductive layer caused by the fin, an absolute etching amount of the gate conductive layer is increased. This in turn substantially increases the likelihood that residue of the gate conductive layer around the fin will undesirably form a spacer. However, when a damascene gate process is used as in the embodiment of the present invention, the difficulties in etching the gate conductive layer can be overcome.

Figure 6A:
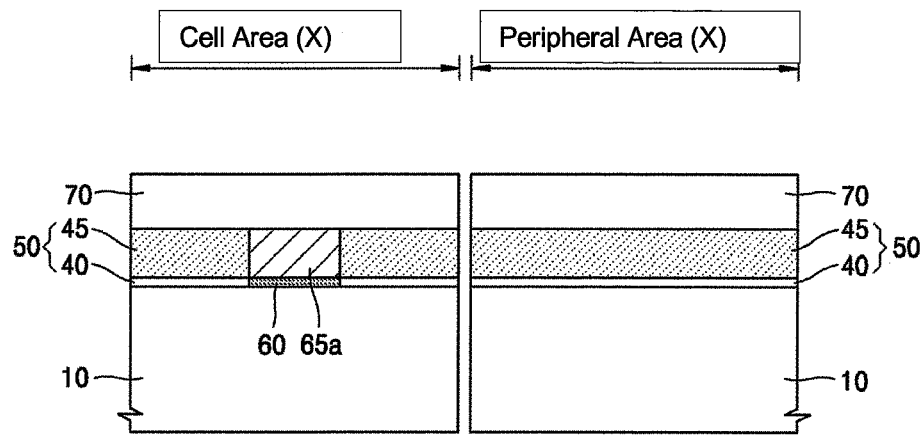
Figure 6B:
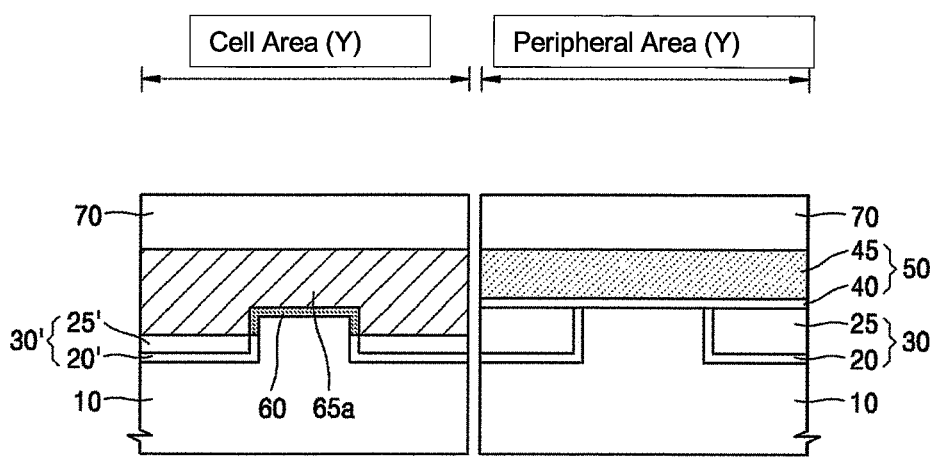

Referring now to FIGS. 6A and 6B, a protective layer 70 is optionally formed on an entire surface of the semiconductor substrate 10 to protect the FinFET gate electrode 65a in subsequent processes. The protective layer may, for example, be an oxide layer deposited by HDP-CVD, and may, for example, be formed of a PEOX layer or a PE-TEOS (tetra-ethyl-ortho-silicate) oxide layer. To form a PEOX layer, a reaction between $SiH_4$ and $O_2$ (or $N_2O$) is utilized, and to form a PE-TEOS, a reaction between $Si(OC_2H_5)_4$ and $O_2$ is utilized. However, formation of the protective layer 70 is not limited to these examples, and the protective layer 70 may be formed using CVD, LPCVD, or spin-on-deposition (SOD) techniques.

Figure 7A:
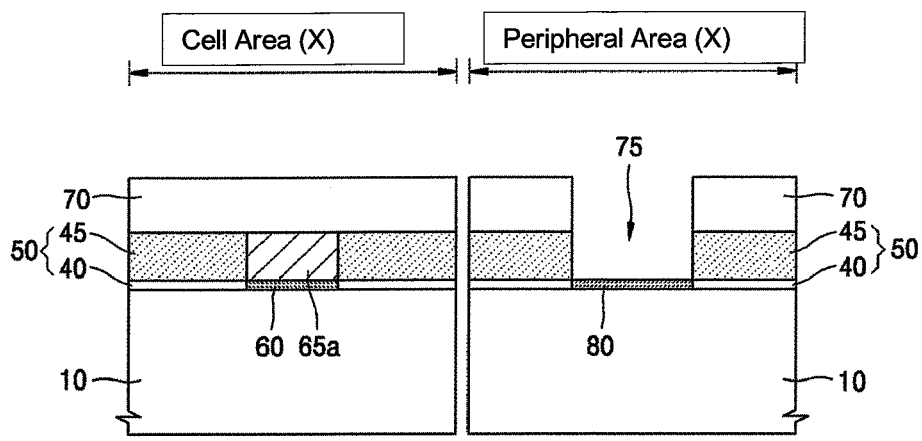
Figure 7B:
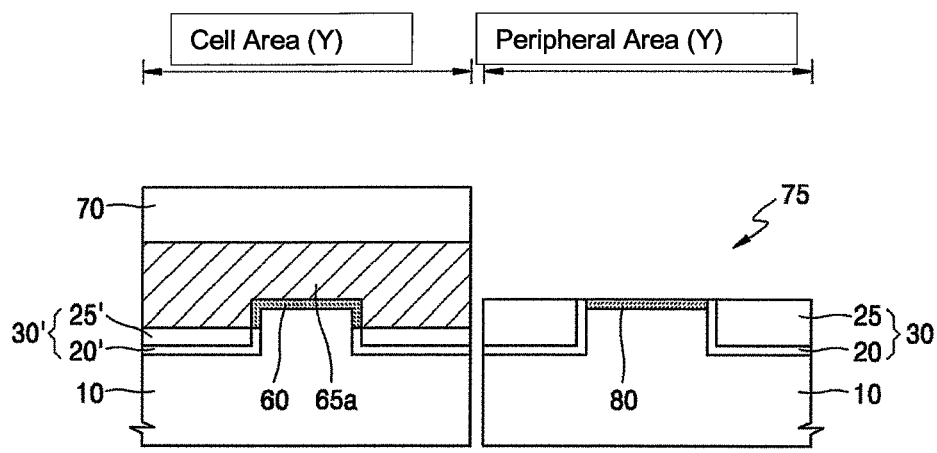

Referring to FIGS. 7A and 7B, the protective layer 70 and the mask layer 50 in the peripheral circuit area are etched to define a MOSFET gate forming region 75. The cell area remains covered with the protective layer 70. Thereafter, a MOSFET gate oxide layer 80 is formed on the surface of the semiconductor substrate 10 within the MOSFET gate forming region 75. The MOSFET gate oxide layer 80 may, for example, be formed by thermal oxidation to grow a silicon oxide layer.

Figure 8A:
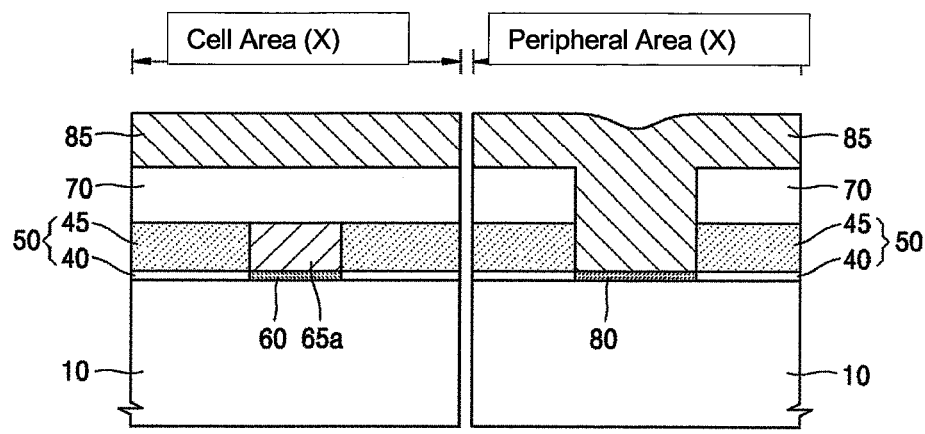
Figure 8B:
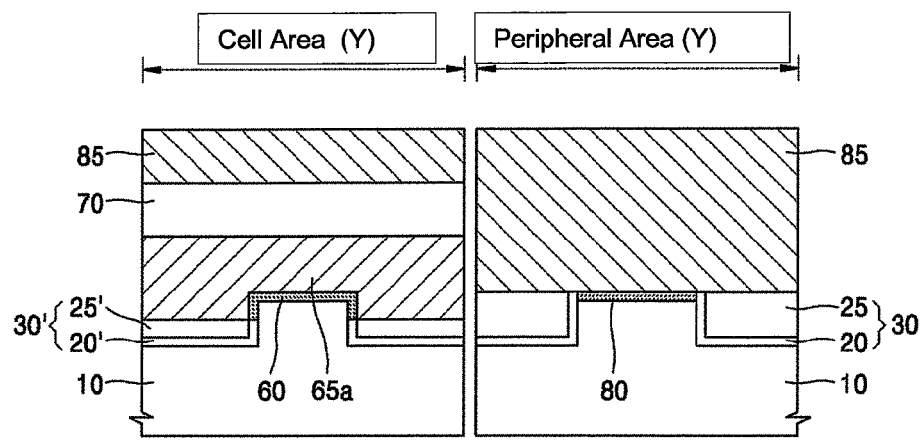

Referring to FIGS. 8A and 8B, a MOSFET gate conductive layer 85 is formed on a surface of the protective layer 70, thereby filling the MOSFET gate forming region 75 (FIG. 7A). The MOSFET gate conductive layer 85 need not be formed in the same manner and of a same material as the FinFET gate conductive layer 65. In this example, the MOSFET gate conductive layer 85 is formed by depositing an undoped polysilicon layer and then implanting ions to achieve conductivity of the layer. However, other methods may be adopted to form the MOSFET gate conductive layer 85.

Figure 9A:
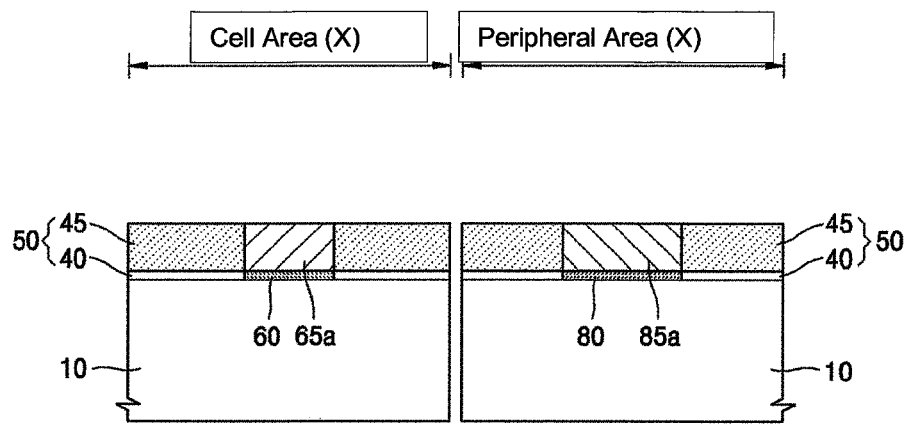
Figure 9B:
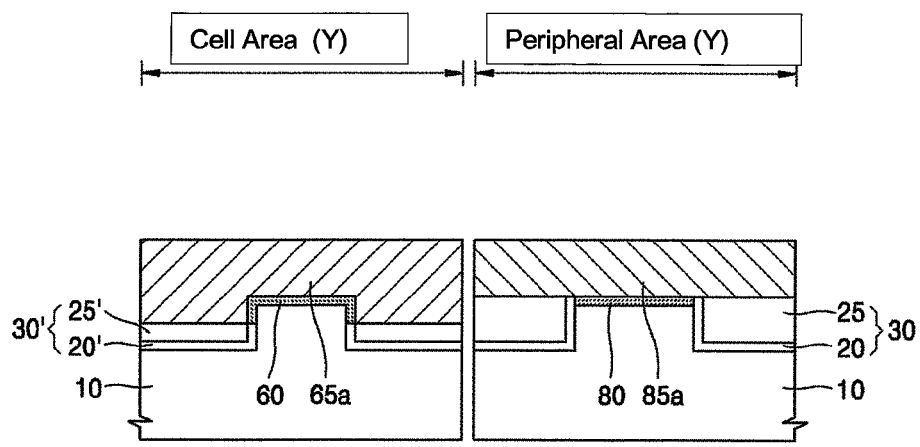

Referring to FIGS. 9A and 9B, the MOSFET gate conductive layer 85 is planarized until the top surface of the mask layer 50 is exposed. In the manner, the protective layer 70 is removed, and a MOSFET gate electrode 85a is formed in a damascene pattern within the MOSFET gate forming region 75 (FIG. 7A). Chemical mechanical polishing (CMP) may be used to planarize the MOSFET gate conductive layer 85.

Figure 10A:
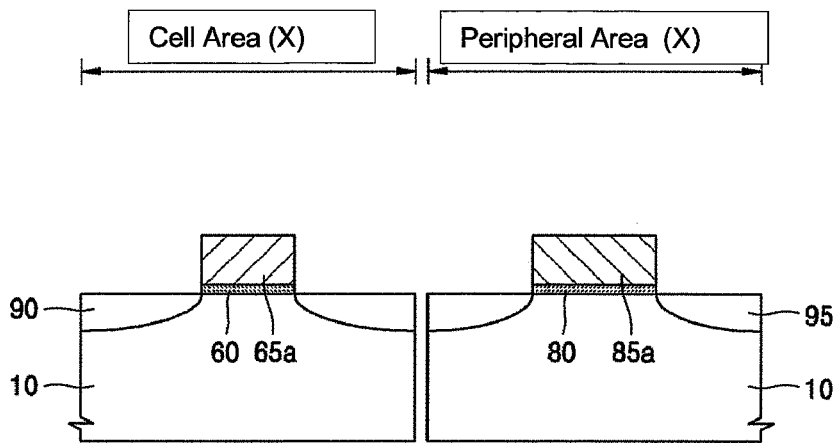
Figure 10B:
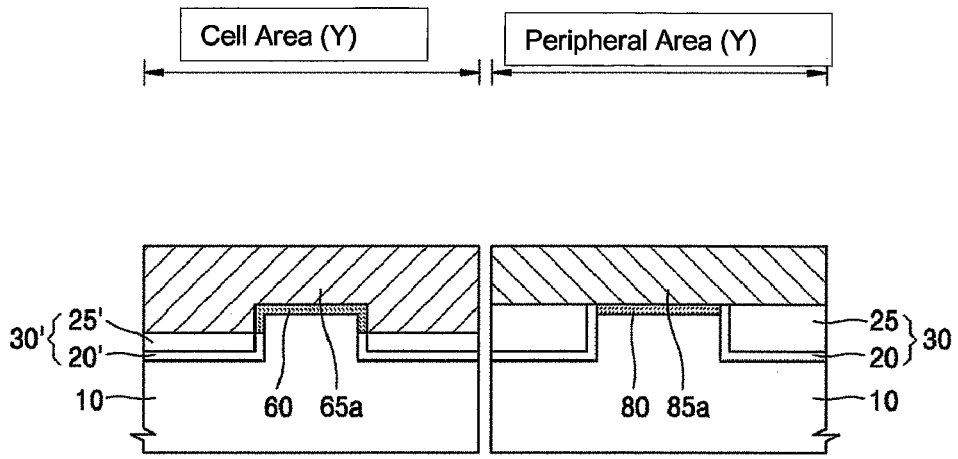

Referring to FIGS. 10A and 10B, the mask layer 50 is removed. For example, a phosphoric acid strip may be used to remove the nitride layer 45 of the mask layer 50, and a wet etch of an HF diluted solution or a BOE solution may be used to remove the oxide layer 40 of the mask layer 50. Optionally, the oxide layer 40 of the mask 50 may not be removed in order to protect the surface of the semiconductor substrate 10.

After the mask layer 50 is removed, an ion-implantation process is performed to form source/drain regions, and optionally to achieve gate doping. That is, when the FinFET gat electrode 65a is formed of an in-situ doped polysilicon layer, FinFET source/drain regions 90 are formed at opposite sides of the FinFET gate electrode 65a without doping of FinFET gate. When only n-type FinFETs are formed, the FinFET gate electrode 65a is formed of an in-situ n+ doped polysilicon layer, and the n-type FinFET source and drain regions are formed. However, when n-type and p-type FinFETs are formed, doping is performed using n-type and p-type appropriate dopants and ion-implantation masks. For example, P, As or Sb ions are implanted to form n-type FinFET source/drain regions. Also for example, B, In or Ga ions are implanted to perform p-type FinFET gate doping, and to form p-type FinFET source/drain regions. In this case, in order to avoid an increase in the threshold voltage of the p-type FinFET, counter doping may be performed at the channel of the p-type FinFET.

Meanwhile, gate doping is performed with respect to the MOSFET gate conductive layer 85 using an n-type or p-type appropriate ion-implantation mask. Thereafter, MOSFET source/drain regions 95 are formed at opposite sides of the MOSFET gate conductive layer 85.

Although not shown, the FinFET source/drain regions 90 and the MOSFET source/drain regions 95 may be formed of a lightly doped drain (LDD) type structure. In this case, spacers are formed at side walls of the FinFET gate electrode 65a and the MOSFET gate electrode 85a between a high-density ion-implantation (about $E15/cm^2$) and a low-density ion-implantation (about $E12/cm^2$-$E13/cm^2$).

FIGS. 11 through 19 are cross-sectional views for explaining a method of manufacturing a semiconductor device according to another embodiment of the present invention. The semiconductor device of this embodiment is characterized at least in part by a plurality of vertically stacked FET devices, for example FinFET devices, of different conductivity types. For example, a first FinFET of a first conductivity type having a layout as shown in the cell area of FIG. 1 is located at a surface of a semiconductor substrate, and a second FinFET of a second conductivity type is located above the first FinFET. In the example that follows, the first conductivity type is an n-type, and the second conductivity type is a p-type. However, the invention is not so limited and the first and second conductivity types can be reversed.

The left portion of each of FIGS. 1 through 19 is a cross-sectional view along the row (X) direction (line a-a') of the cell area shown in FIG. 1. The right portion of each of FIGS. 11 through 19 is a cross-sectional view along the column (Y) direction (line b-b') of the cell area of FIG. 1. The peripheral circuit area may, for example, include a MOSFET such as that described in the previous embodiment. Such a configuration is described later in connection with a subsequent embodiment. Alternately, as another example, the peripheral circuit area may include vertically stacked FinFETs similar to those contained in the cell area of the present embodiment.

The present embodiment is applicable to any type of semiconductor device containing a FinFET. However, this embodiment is particularly suited to implementation in static random access memory (SRAM) technology. In an SRAM, two NMOS devices and two PMOS devices form a storage cell, and two additional NMOS devices are used as a pass-gate transistor for controlling connection between the storage cell and a bit line. In the example of the present embodiment, the NMOS and PMOS devices of the SRAM may be replaced with n-type and a p-type FinFETs, respectively. Also, in this example, the n-type FinFETs used for the pass-gate transistor and the storage cell may be formed in a lower layer, and then the p-type FinFETs used for the storage cell may be formed above the n-type FinFETs. It is noted, however, that the p-type FinFETs may instead be formed in the lower layer, and the n-type FinFETs may be formed above the p-type FinFETs.

Figure 11:
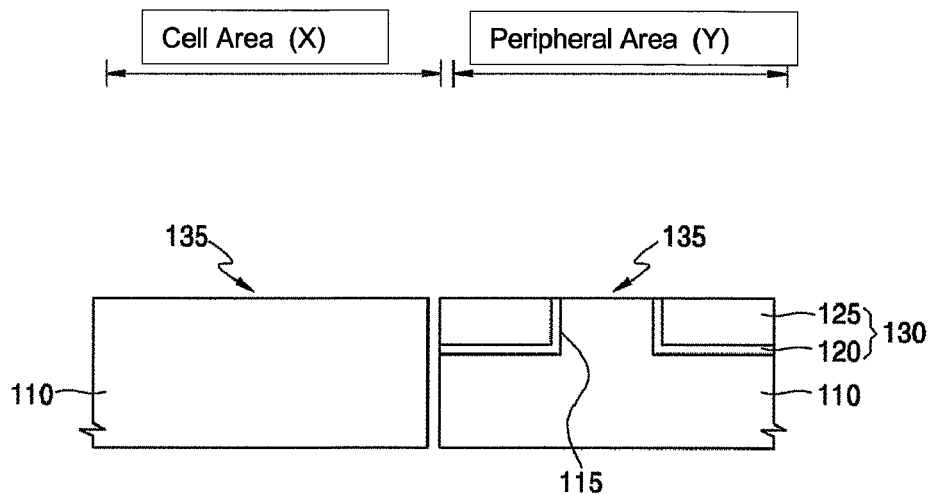
FIGS. 11 through 19 are cross-sectional views for explaining a method of manufacturing a semiconductor device according to another embodiment of the present invention, where the left portion of each of FIGS. 11 through 19 is a cross-sectional view along the row (X) direction (line a-a') of the cell area shown in FIG. 1, and where the right portion of each of FIGS. 11 through 19 is a cross-sectional view along the column (Y) direction (line b-b') of the cell area of FIG. 1.

Referring now to FIG. 11, an isolation layer 130 is formed in a semiconductor substrate 110, for example, in a bulk silicon substrate. A first active region 135 is defined where the isolation layer 130 is not formed in the semiconductor substrate 110. The isolation layer 130 may, for example, be formed in the same manner as described above in connection with the previous embodiment. In that case, a portion of the semiconductor substrate 110 is etched, thereby forming a trench 115. Next, an insulating layer liner 120 is formed on an inner wall of the trench 115, and thereafter, a gap fill oxide layer 125 is formed to fill the trench 115. Subsequently, the gap fill oxide layer 125 and the insulating layer liner 120 are planarized, thereby forming the isolation layer 130 that is buried in the surface of the semiconductor substrate 110.

Figure 12:
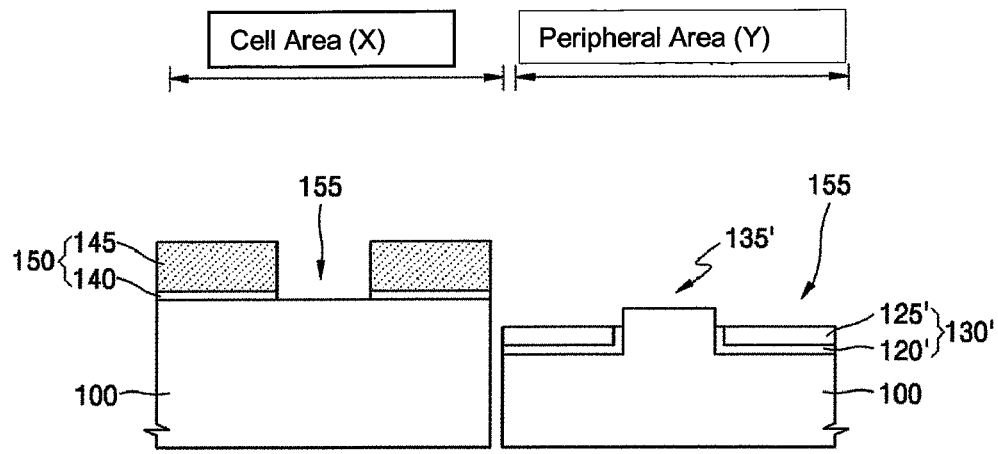

Next, as shown in FIG. 12, a mask layer 150 of this example is formed on the semiconductor substrate 110. The mask layer 150 is formed as a stack of a mask oxide layer 140 and a mask nitride layer 145. Next, the mask layer 150 is etched to open a first gate forming region 155 (for a first conductivity type FinFET). The insulating layer liner 120 and the gap fill oxide layer 125 of the insulating layer 130 are then etched through the mask until the first active region 135 is higher than the etched isolation layer 130'. In this manner, a fin 135' is formed.

Figure 13:
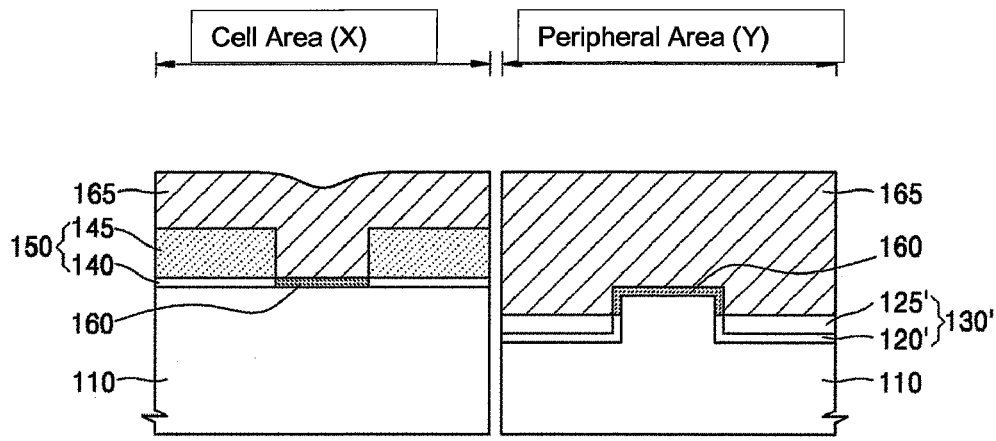

Referring now to FIG. 13, a first gate oxide layer 160 (for the first conductivity type FinFET) is formed on a surface of the fin 135' (FIG. 12) of the semiconductor substrate 110 within the exposed first gate forming region 155 (FIG. 12). The first gate oxide layer 160 may, for example, be a silicon oxide layer that is grown by thermal oxidation. Next, a first gate conductive layer 165 (for the first conductivity type FinFET) is formed on a surface of the mask layer 150 so as to fill the first gate forming region 155 (FIG. 12). The first gate conductive layer 165 may, for example, be formed of an in-situ n+ doped polysilicon layer.

Figure 14:
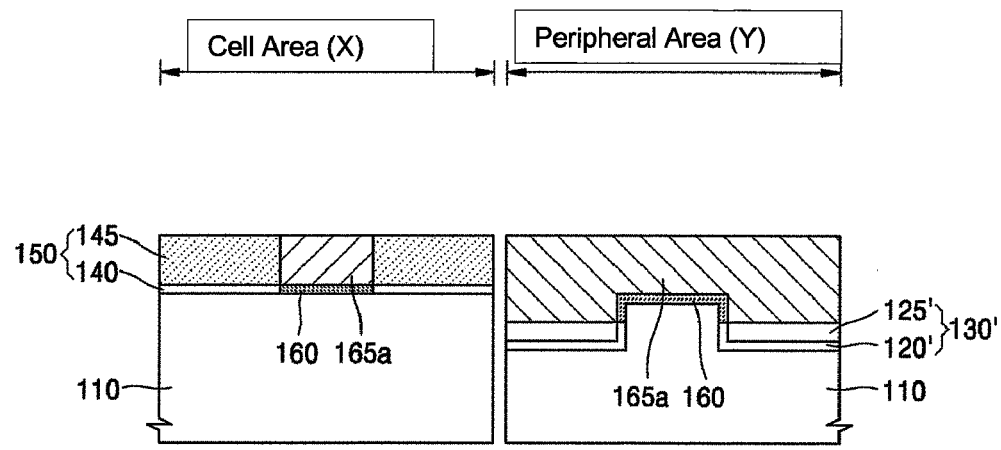

Referring to FIG. 14, the first gate conductive layer 165 is planarized, for example, by CMP, until a top surface of the mask layer 150 is exposed. In this manner, a first gate electrode 165a (for the first conductivity type FinFET) is advantageously formed within the first gate forming region 155 (FIG. 12) in a damascene pattern.

However, the present embodiment is not limited to formation of the first gate electrode 165a in a damascene pattern. For example, the first gate electrode may instead be formed in accordance with the conventional technique of forming a fin, forming a gate conductive layer, and then patterning the gate conductive layer.

Figure 15:
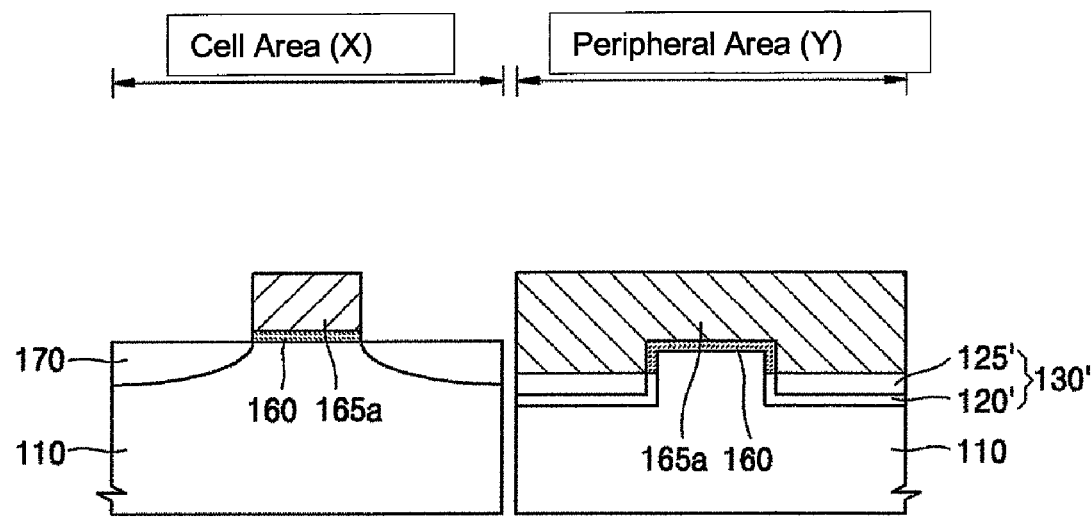

Referring next to FIG. 15, the mask layer 150 is removed, and ion-implantation is performed to optionally achieve gate doping and to form source/drain regions. For example, when the first gate electrode 165a is formed of an in-situ n+ doped polysilicon layer, source/drain regions 170 are formed in the cell area without FinFET gate doping. Also, the first source/drain regions 170 may be formed of an LDD structure. In this case, additional processes of forming spacers at side walls of the first gate electrode 165a and conducting an additional ion implantation are needed.

Figure 16:
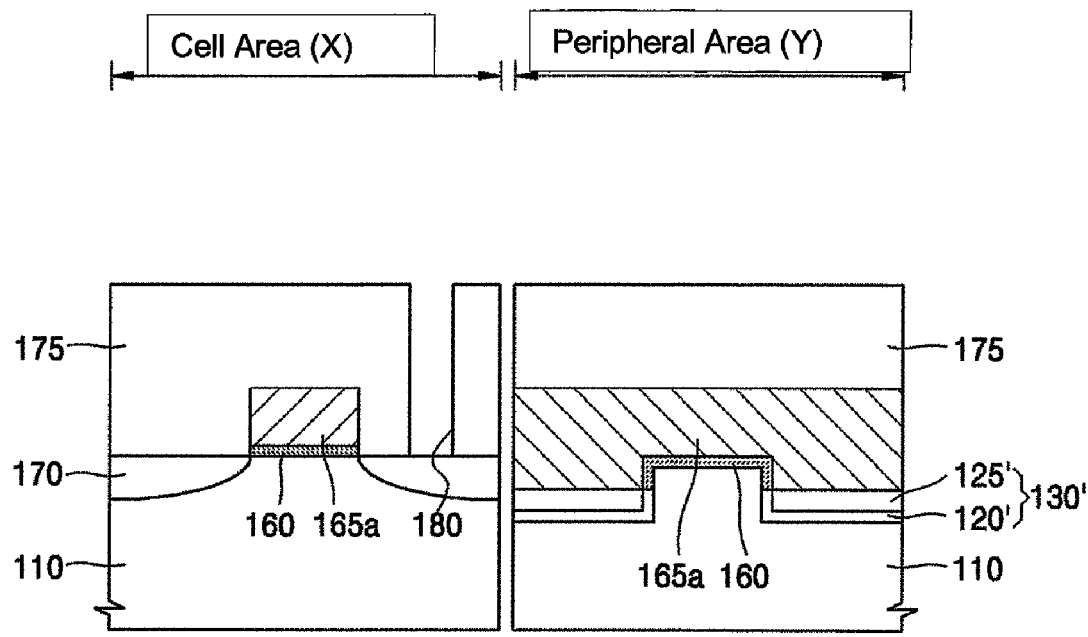

Referring to FIG. 16, an interlayer insulating layer 175, e.g., an HDP-CVD oxide layer, is formed on an entire surface of the semiconductor substrate 110. Next, a through-hole 180 is formed in the interlayer insulating layer 175 to expose one of the first source/drain regions 170.

Figure 17:
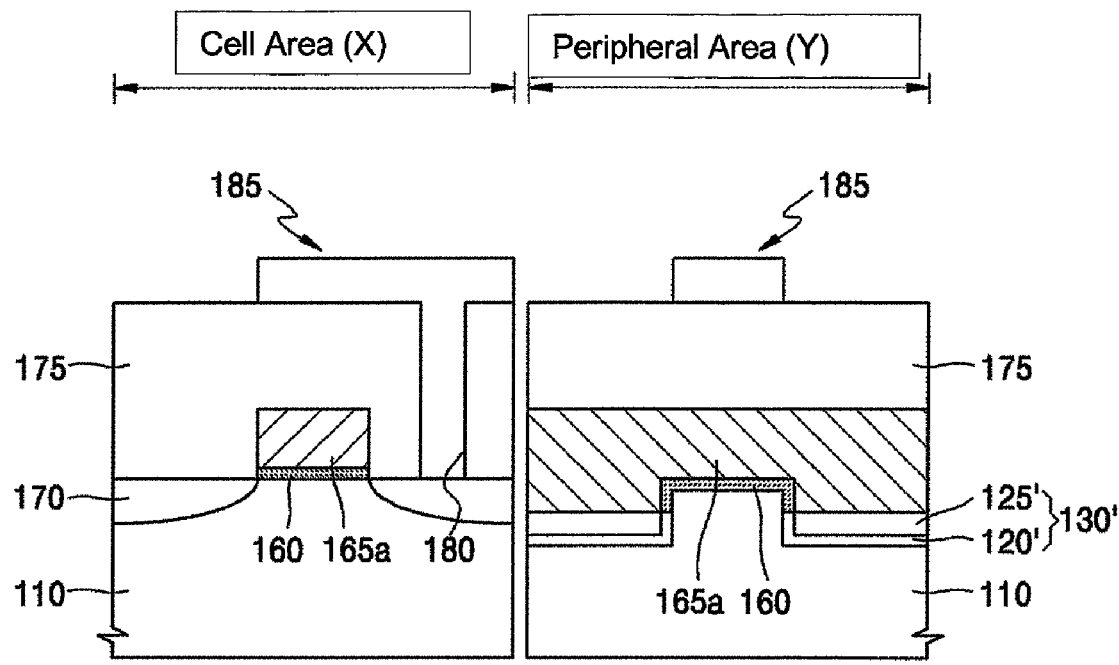

Referring next to FIG. 17, selective epitaxial growth (SEG) of silicon is then performed from the surface portion of the source/drain region 170 exposed by the through-hole 180. In this manner, a silicon layer is formed which fills the through-hole 180 and extends over the interlayer insulating layer 175. Then, the silicon layer is patterned to define a second active region 185 having a fin shaped configuration. The second active region 185 is for forming a second conductivity type FinFET.

Figure 18:
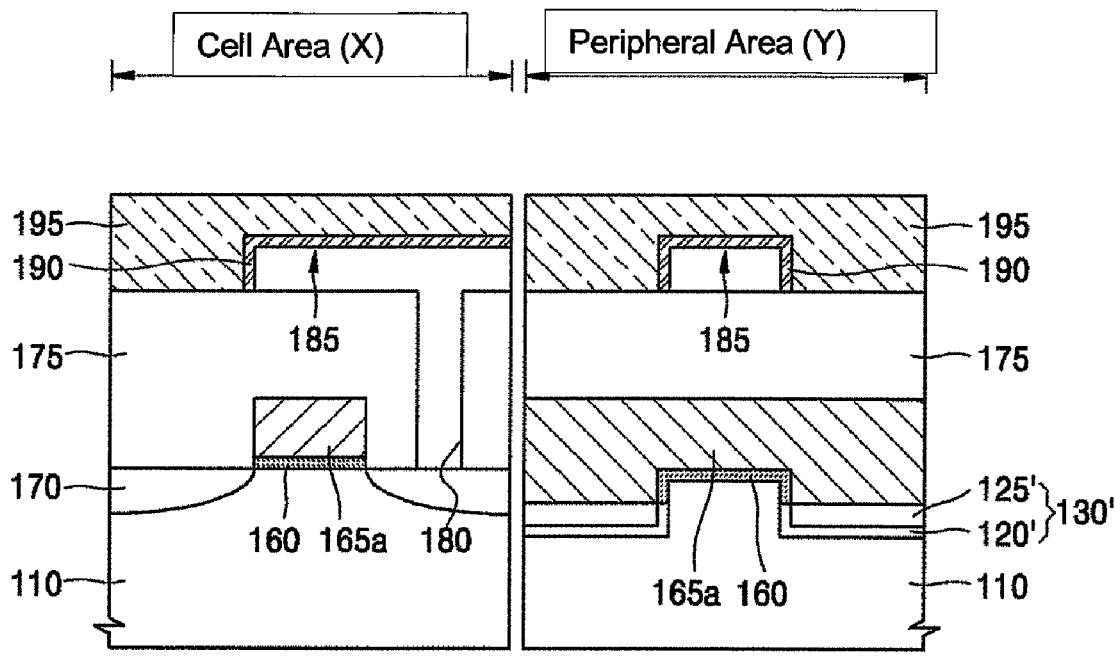

That is, referring to FIG. 18, a second gate oxide layer 190 (for the second conductivity type FinFET) is formed on the second active region 185. The second oxide layer 190 may, for example, be a silicon oxide layer that is grown by thermal oxidation. Next, a second gate conductive layer 195 (for the second conductivity type FinFET) is formed. A material of the second gate conductive layer 195 may be different than that of the first gate conductive layer 165. For example, the second gate conductive layer 195 may be formed of an in-situ p+ doped polysilicon. However, it is preferable to form the second gate conductive layer 195 by forming an undoped polysilicon layer, and then doping the undoped polysilicon layer in a subsequent process.

Figure 19:
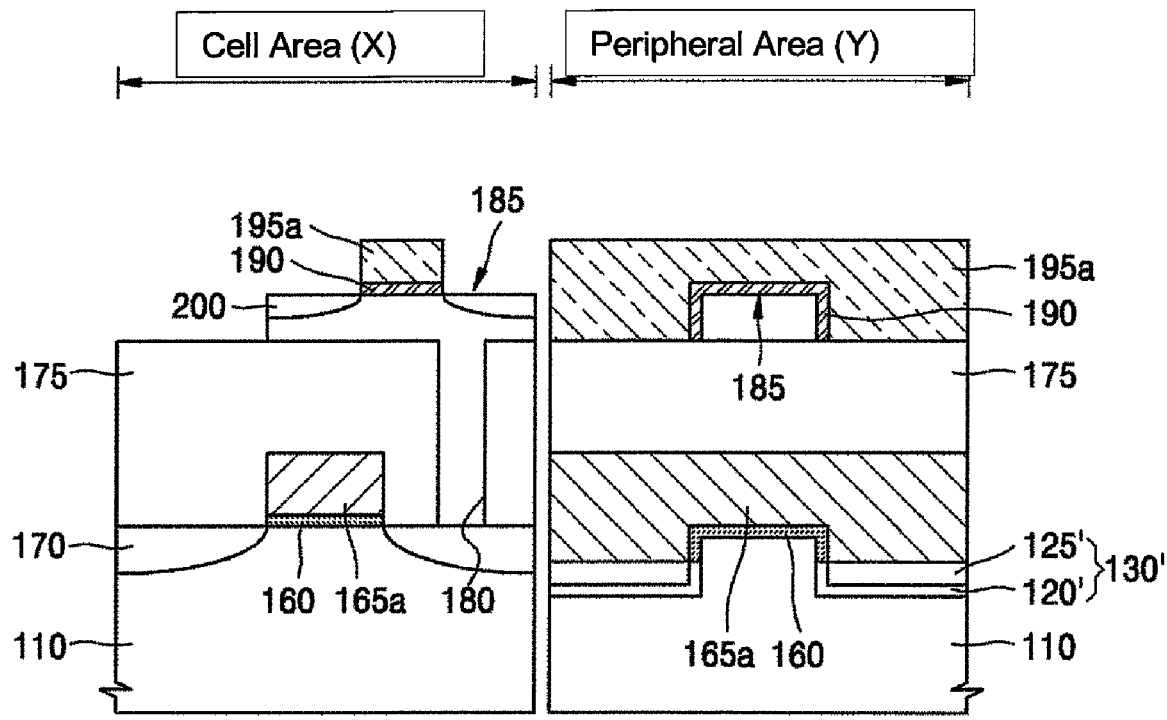

Referring to FIG. 19, the second gate conductive layer 195 is patterned to form a second gate electrode 195a. Subsequently, gate doping is optionally performed, and second source/drain regions 200 (for the second conductivity type FinFET) are implanted at opposite sides of the second gate electrode 195a. For example, when the second gate electrode 195a is formed of an in-situ p+ doped polysilicon layer, the second source/drain regions 200 are formed in the second active region 185 without performing FinFET gate doping. Also, when the second gate electrode 195a is formed of an undoped polysilicon layer, the second source/drain regions 200 may be formed of an LDD structure. In this case, additional processes of forming spacers at side walls of the second gate electrode 195a and conducting an additional ion implantation are needed.

In the example illustrated in connection with the embodiment of FIGS. 11 through 19, the gate of the first conductivity type FinFET is formed using a damascene method, and the gate of the second conductivity type FinFET is formed using a patterning method. However, the embodiment is not limited by the manner in which the gates are fabricated. For example, the gate of the first conductivity type FinFET may instead be formed by patterning, and the gate of the second conductivity type FinFET may instead be formed using the damascene method.

The semiconductor device of the embodiment of FIG. 19 includes a first conductivity type FinFET and a second conductivity type FinFET that is stacked over the first FinFET. The stacked FinFETS are in formed in the cell area of the semiconductor substrate 110. The first conductivity type FinFET includes the first gate oxide layer 160, the first gate electrode 165a, and the first source/drain regions 170, all formed at the first active region 135. The interlayer insulating layer 175 is formed on the first conductivity type FinFET. The second active region 185 penetrates the interlayer insulating layer 175 and is connected with one of the first source/drain regions 170 and extends over the interlayer insulating layer 175. The second conductivity type FinFET includes the second gate oxide layer 190, the second gate electrode 195a, and the second source/drain regions 200, all formed at the second active region 185.

As previously mentioned, in the example of this embodiment, the first conductivity type FinFET is formed using a damascene method. As such, the surface of the isolation layer 130' is lower than the exposed upper surface of semiconductor substrate 110. Thus, the first active region 135 forms the fin 135' which is higher than the surface of the isolation layer 130'. The first conductivity type FinFET gate oxide layer 160 is formed along the surface of the fin 135'. The first conductivity type FinFET gate electrode 165a has a flat top surface and surrounds the fin 135'. The second active region 185 is a silicon layer selectively and epitaxially grown from one of the first source/drain regions 170.

When a plurality of FinFETs of different conductivity types are to be formed in a cell area, it is preferred that all of the FinFETs formed in a lower layer have a first conductivity type, while all of the FinFETs formed in an upper layer have a second conductivity type. For example, when an SRAM cell is constructed of n-type FinFETs and p-type FinFETs as mentioned previously, it is preferred that the n-type FinFETs all be formed in one layer, and the p-type FinFETs all be formed in another layer.

Vertical stacking of the FinFETs increases the integration density of the semiconductor device. Also, since the gate conductive layers of the different conductivity type FinFETs are preferably not contained in the same layer, it is possible to tailor the fabrication of each type of gate conductive layer in a manner best suited the characteristics of the conductivity type of each gate conductive layer.

FIGS. 20A through 32B are cross-sectional views for explaining a method of fabricating a semiconductor device according to another embodiment of the present invention. The semiconductor device of this embodiment is at least partially characterized by the cell area containing FinFETs of different conductivity types, and the peripheral circuit area containing a MOSFET. In the example that follows, a p-type FinFET is formed over an n-type FinFET in the cell area. The invention, of course, is not so limited.

The left portion of each of FIGS. 20A, 21A, 22A, 23A, 24A, 25A, 26A, 27A, 28A, 29A, 30A, 31A, and 32A are cross-sectional views taken along the row (X) direction (line a-a') of the cell area of FIG. 1. The right portion of each of FIGS. 20A, 21A, 22A, 23A, 24A, 25A, 26A, 27A, 28A, 29A, 30A, 31A, and 32A are cross-sectional views taken along the row (X) direction (line a-a') of the peripheral circuit area of FIG. 1. The left portion of FIGS. 20B, 21B, 22B, 23B, 24B, 25B, 26B, 27B, 28B, 29B, 30B, 31B, and 32B are cross-sectional views taken along the column (Y) direction (line b-b') of the cell area of FIG. 1. The right portion of FIGS. 20B, 21B, 22B, 23B, 24B, 25B, 26B, 27B, 28B, 29B, 30B, 31B, and 32B are cross-sectional views taken along the column (Y) direction (line b-b') of the peripheral circuit area of FIG. 1.

Figure 20A:
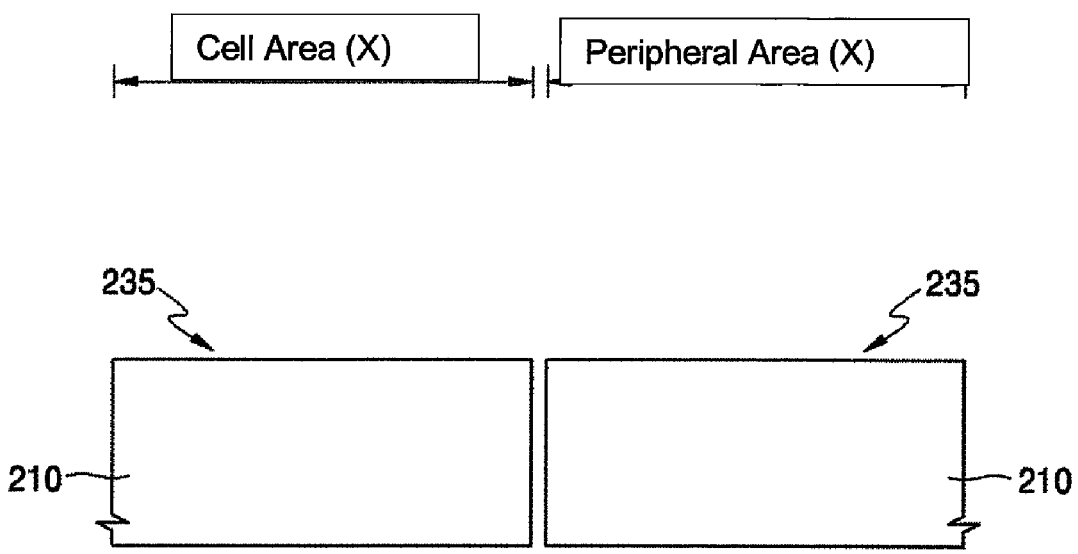
FIGS. 20A through 32B are cross-sectional views for explaining a method of fabricating a semiconductor device according to another embodiment of the present invention, where the left portion of each of FIGS. 20A, 21A, 22A, 23A, 24A, 25A, 26A, 27A, 28A, 29A, 30A, 31A, and 32A are cross-sectional views taken along the row (X) direction (line a-a') of the cell area of FIG. 1, where the right portion of each of FIGS. 20A, 21A, 22A, 23A, 24A, 25A, 26A, 27A, 28A, 29A, 30A, 31A, and 32A are cross-sectional views taken along the row (X) direction (line a-a') of the peripheral circuit area of FIG. 1, where the left portion of each of FIGS. 20B, 21B, 22B, 23B, 24B, 25B, 26B, 27B, 28B, 29B, 30B, 31B, and 32B are cross-sectional views taken along the column (Y) direction (line b-b') of the cell area of FIG. 1, and where the right portion of each of FIGS. 20B, 21B, 22B, 23B, 24B, 25B, 26B, 27B, 28B, 29B, 30B, 31B, and 32B are cross-sectional views taken along the column (Y) direction (line b-b') of the peripheral circuit area of FIG. 1.
Figure 20B:
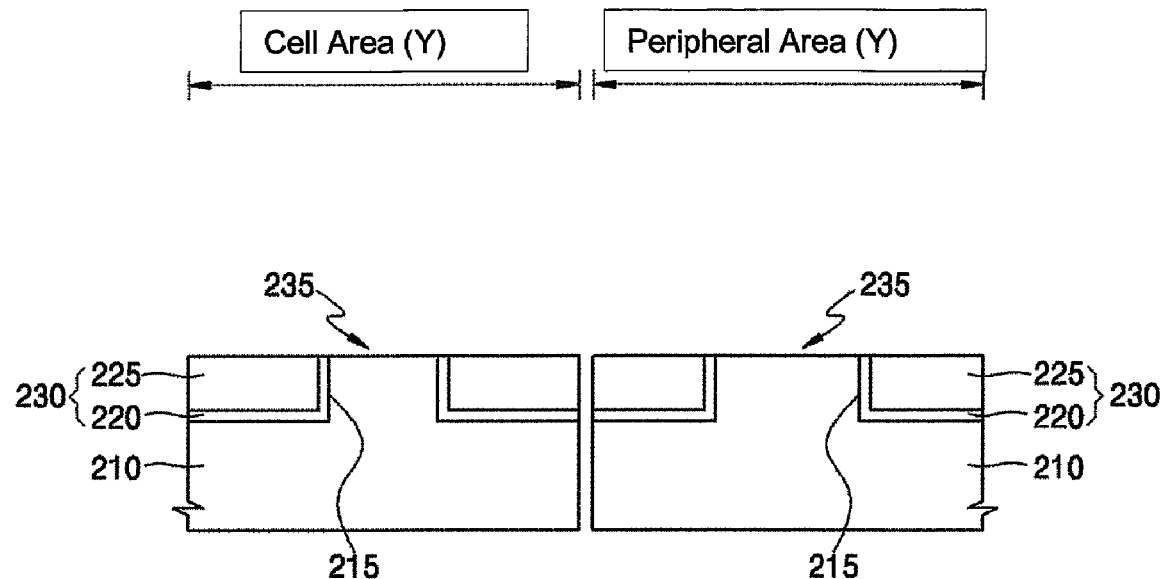

Referring to FIGS. 20A and 20B, an isolation layer 230 is formed in a semiconductor substrate 210, for example, in a bulk silicon substrate. A first active region 235 is defined where the isolation layer 230 is not formed in the surface of the semiconductor substrate 210. The isolation layer 230 also defines a cell area and a peripheral circuit area.

The isolation layer 230 may, for example, be formed in the same manner as in previous embodiments. In this case, a portion of the semiconductor substrate 210 is etched to form a trench 215. Next, an insulating layer liner 220 is formed on an inner wall of the trench 215, and then the trench is filled with a gap fill oxide layer 225. Subsequently, the gap fill oxide layer 225 and the insulating layer liner 220 are planarized to define the isolation layer 230 buried in the surface of the semiconductor substrate 210.

Figure 21A:
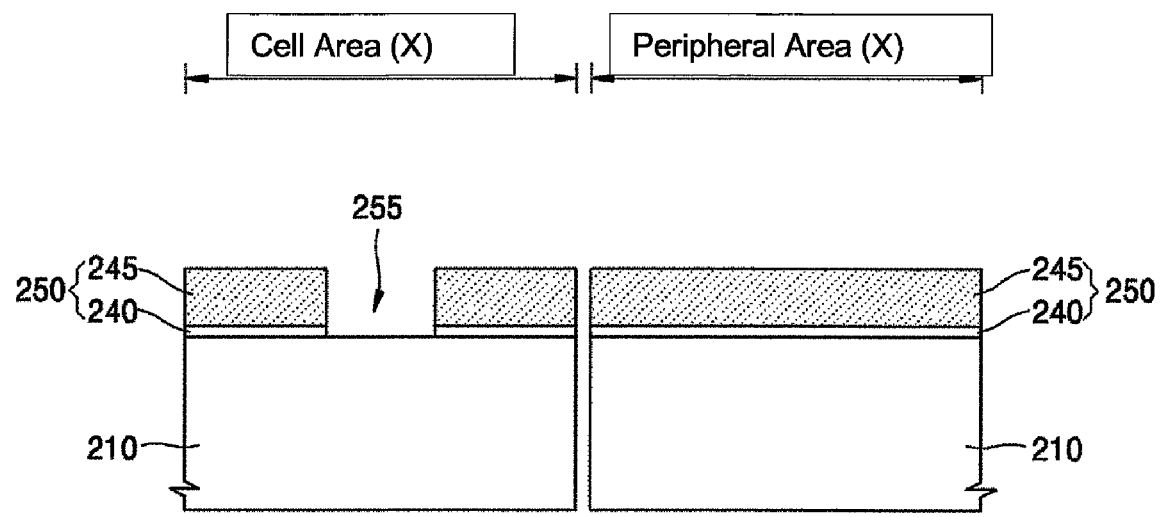
Figure 21B:
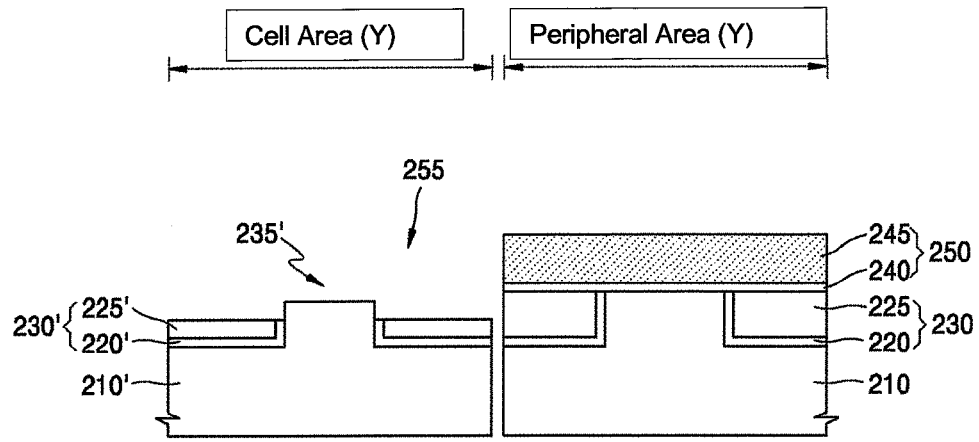

Referring to FIGS. 21A and 21B, a mask layer 250 is formed by stacking a mask oxide layer 240 and a mask nitride layer 245 on the semiconductor substrate 210. The mask layer 250 is then etched to open a first gate forming region 255. Next, the insulating layer liner 220 and the gap fill oxide layer 225 of the insulation layer 230 are etched through the mask layer 250 such that an upper surface of the first active region 235 is higher than the surface of the etched isolation layer 230'. In this manner, a fin 235' is formed.

Figure 22A:
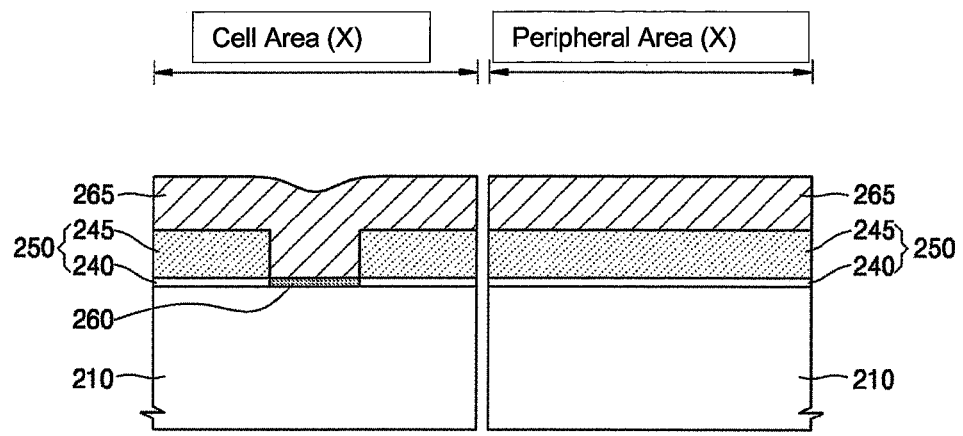
Figure 22B:
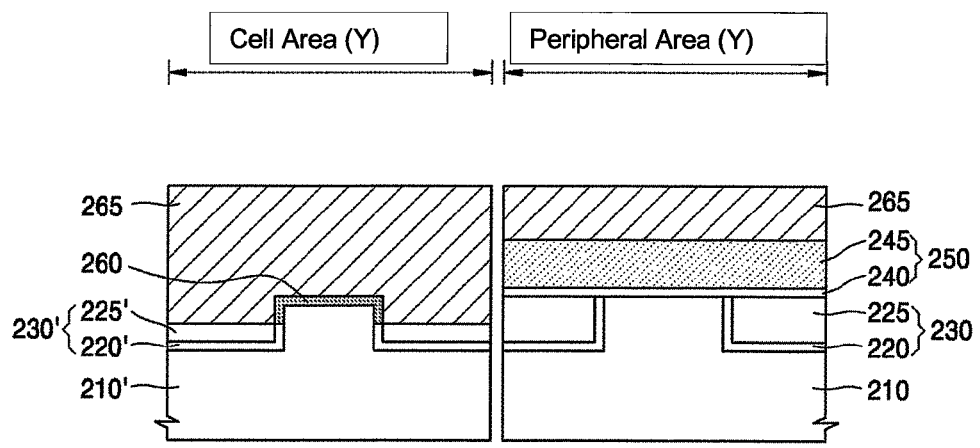

Referring to FIGS. 22A and 22B, a first gate oxide layer 260 is then formed on the surface of the fin 235' (FIG. 21B) within the exposed first gate forming region 255 (FIG. 21A). The first gate oxide layer 260 may, for example, be a silicon oxide layer that is grown by thermal oxidation. Next, a first gate conductive layer 265 is formed on a surface of the mask layer 250 so as to fill the first gate forming region 255 (FIG. 21A). The first gate conductive layer 265 may be formed of an in-situ n+ doped polysilicon layer.

Figure 23A:
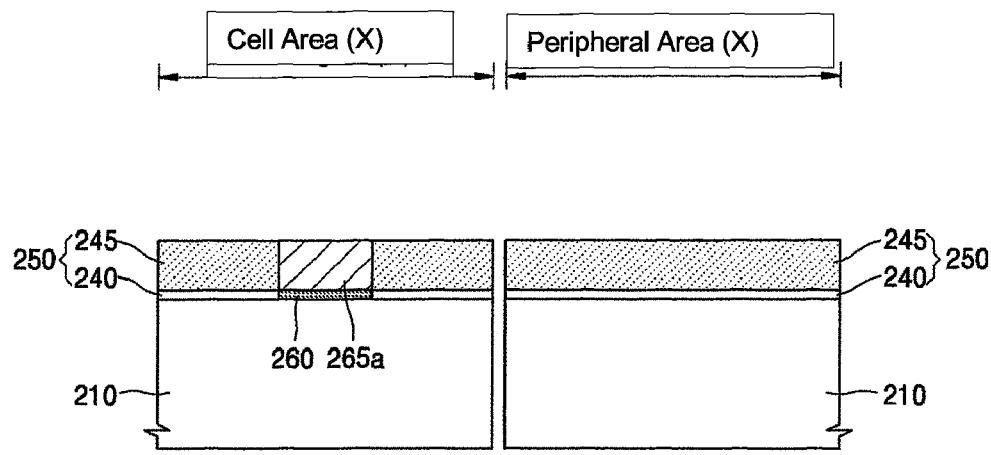
Figure 23B:
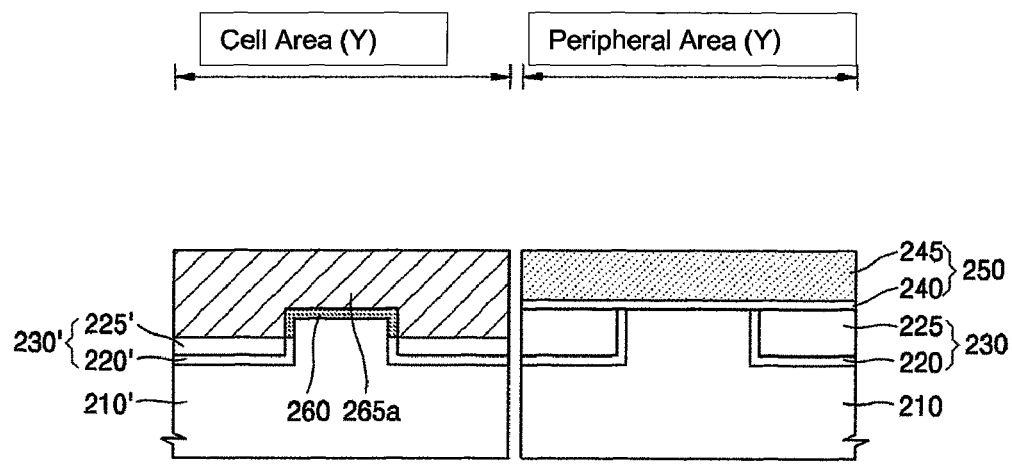

Referring next to FIGS. 23A and 23B, the first gate conductive layer 265 is planarized, for example, by CMP, until a top surface of the mask layer 250 is exposed. In this manner, a first gate electrode 265a is advantageously formed within the first gate forming region 255 (FIG. 21A) in a damascene pattern.

Figure 24A:
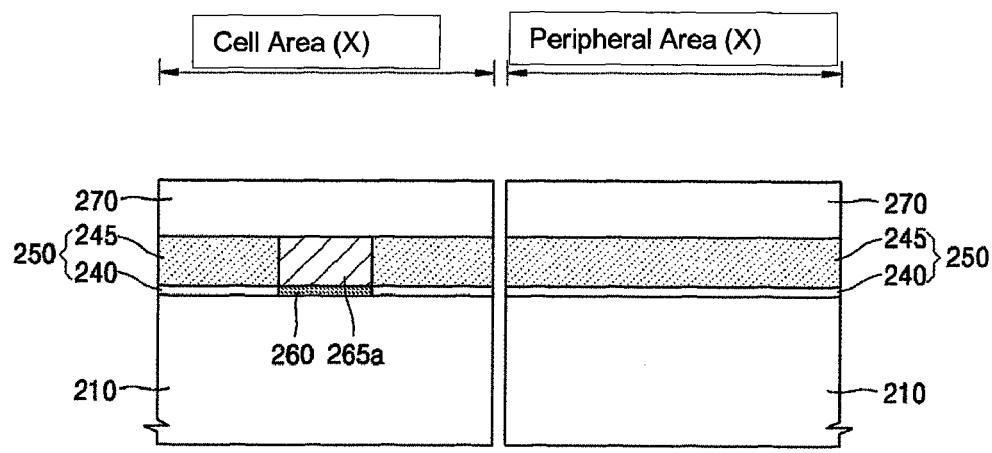
Figure 24B:
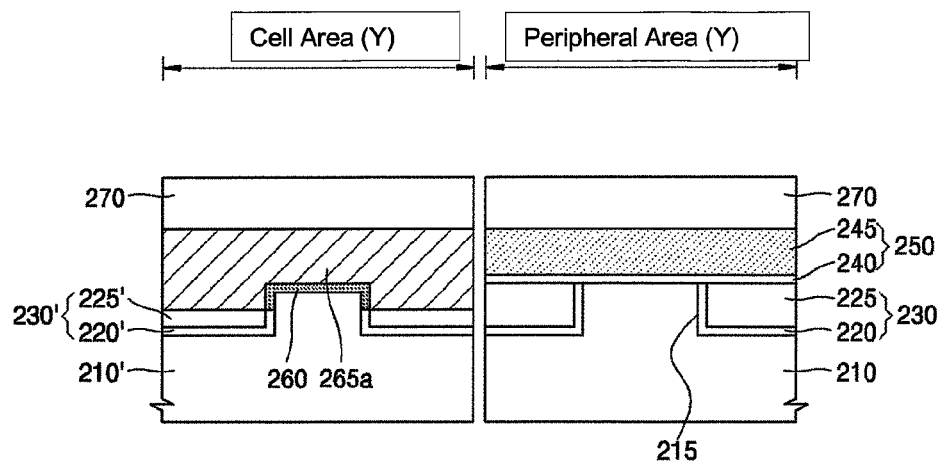

Referring to FIGS. 24A and 24B, a protective layer 270, e.g., an HDP-CVD oxide layer, is formed on an entire surface of the semiconductor substrate 210. The protective layer 270, which is optional and may be omitted, functions to protect the first gate electrode 265a in subsequent processes.

Figure 25A:
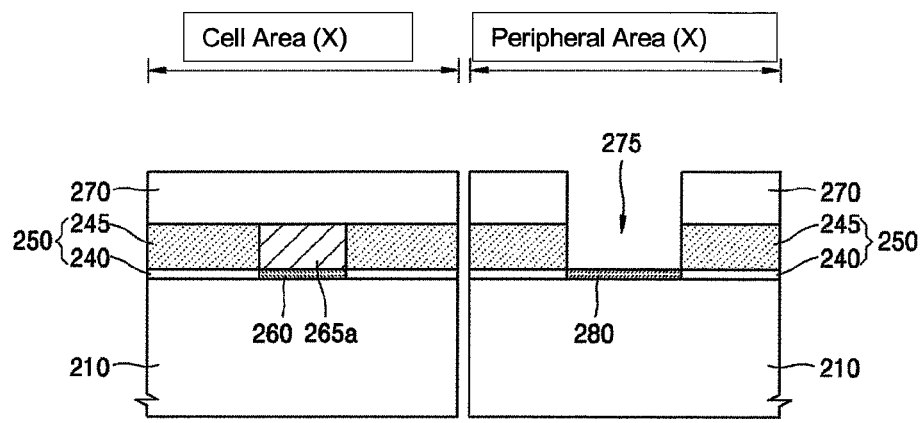
Figure 25B:
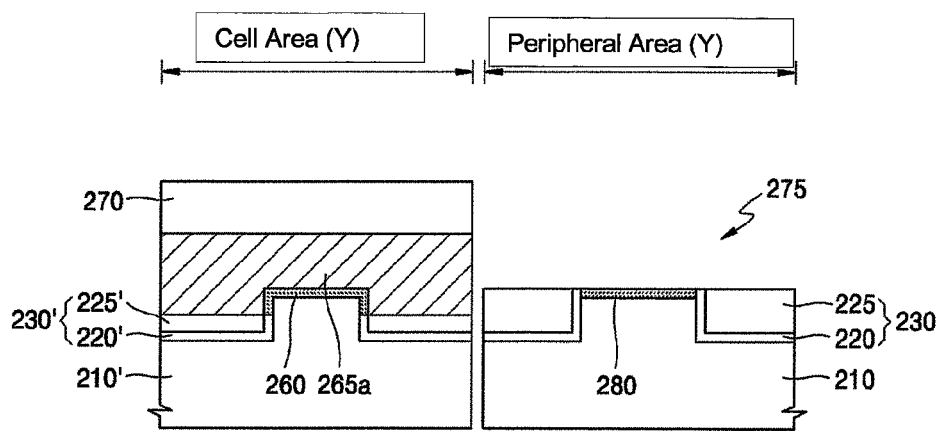

Referring to FIGS. 25A and 25B, the protective layer 270 and the mask layer 250 in the peripheral circuit area are etched to create a MOSFET gate forming region 275. Here, the cell area remains covered with the protective layer 270. Thereafter, a MOSFET gate oxide layer 280 is formed on the surface of the semiconductor substrate 210 within the MOSFET gate forming region 270. The MOSFET gate oxide layer 280 may, for example, be a silicon oxide layer that is grown by thermal oxidation.

Figure 26A:
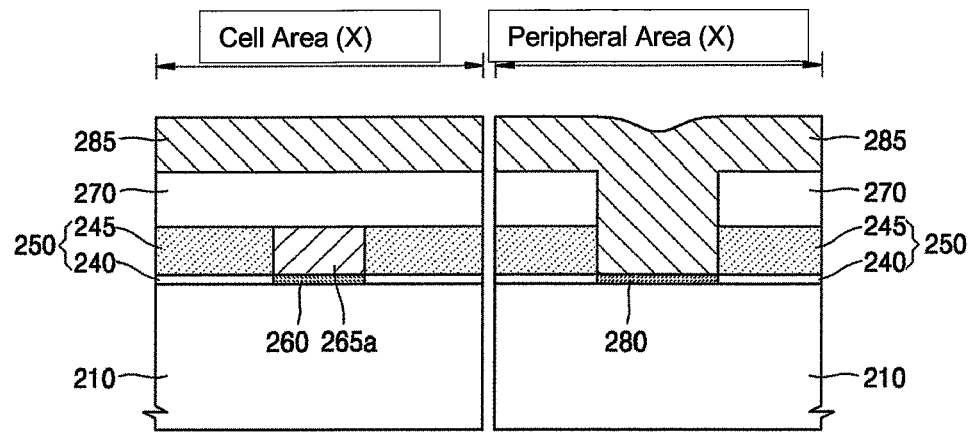
Figure 26B:
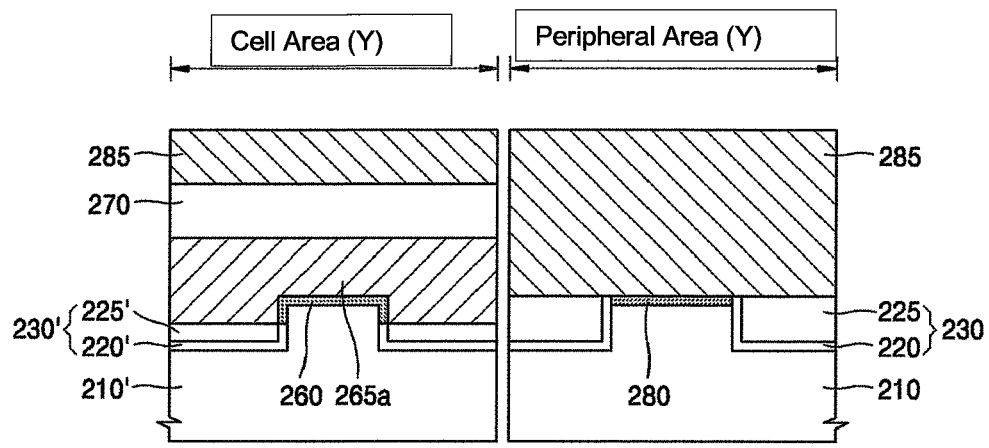

Referring to FIGS. 26A and 26B, a MOSFET gate conductive layer 285 is formed on a surface of the protective layer 270 so as to fill the MOSFET gate forming region 275 (FIG. 25A). The MOSFET gate conductive layer 285 may be formed of an undoped polysilicon layer.

Figure 27A:
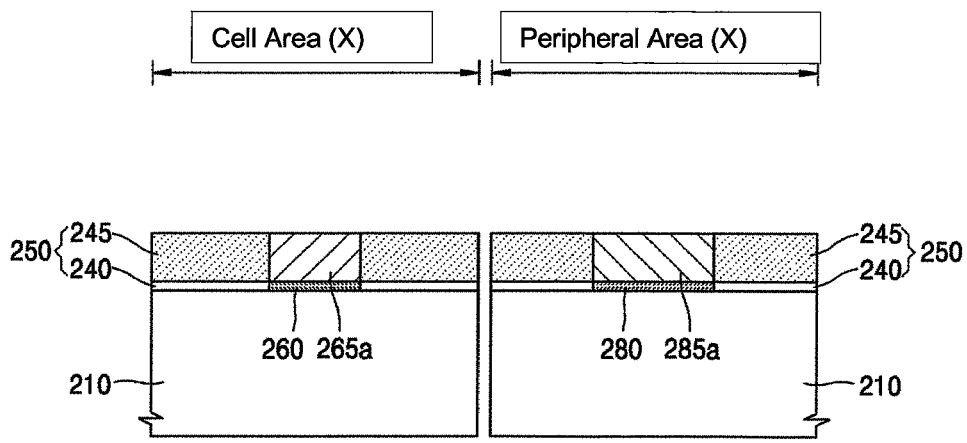
Figure 27B:
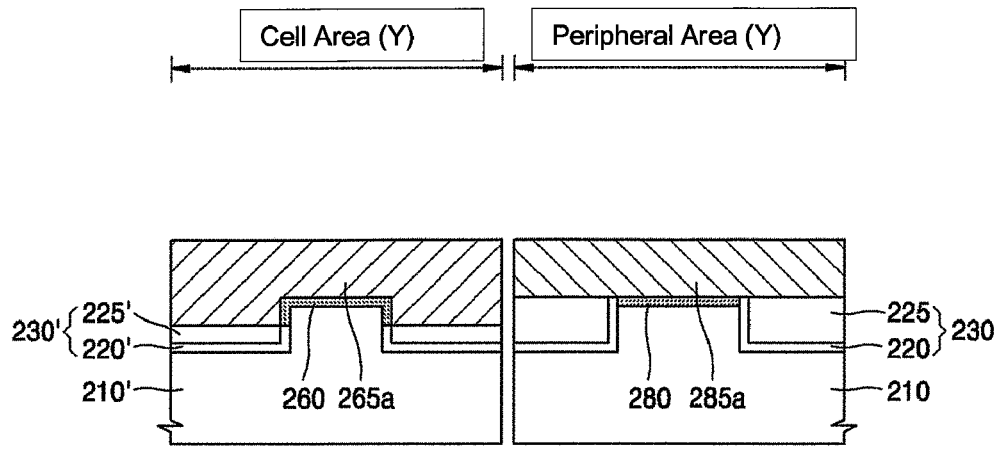

Referring to FIGS. 27A and 27B, the MOSFET gate conductive layer 285 is planarized until the top surface of the mask layer 250 is exposed. In this manner, a MOSFET gate electrode 285a is formed within the MOSFET gate forming region 275 (FIG. 25A) in a damascene pattern. CMP may, for example, be used to planarize the MOSFET gate conductive layer 285.

Figure 28A:
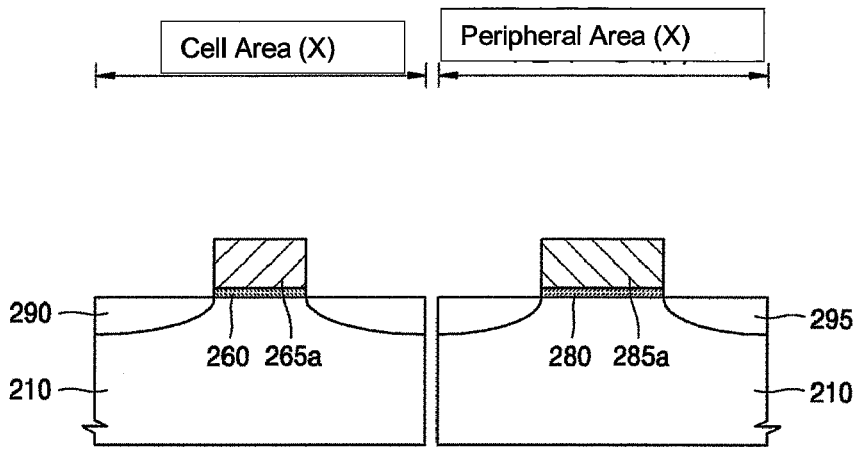
Figure 28B:
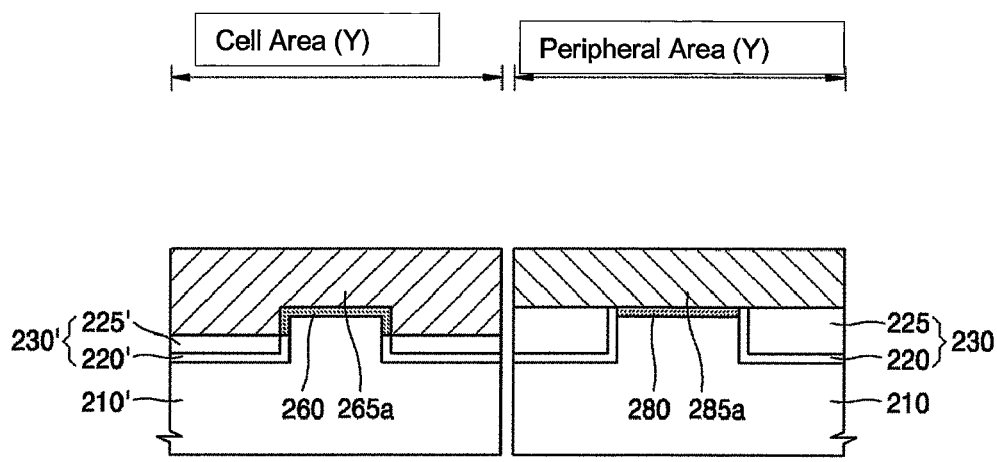

Referring next to FIGS. 28A and 28B, the mask layer 250 is removed, and ion-implantation is performed to optionally achieve gate doping and to form source/drain regions. For example, when the first gate electrode 265a is formed of an in-situ n+ doped polysilicon layer, the first source/drain regions 290 are formed in the cell area without FinFET gate doping.

Meanwhile, gate doping may be performed with respect to the MOSFET gate conductive layer 285 using an ion-implantation mask appropriate to the n-type or the p-type of conductivity, and then MOSFET source/drain regions 295 may be formed. Also, the first source/drain regions 290 and the MOSFET source/drain regions 295 may be formed of an LDD structure. In this case, additional processes of forming spacers at side walls of the first gate electrode 265a and the MOSFET gate electrode 285a and conducting additional ion implantations are needed.

Figure 29A:
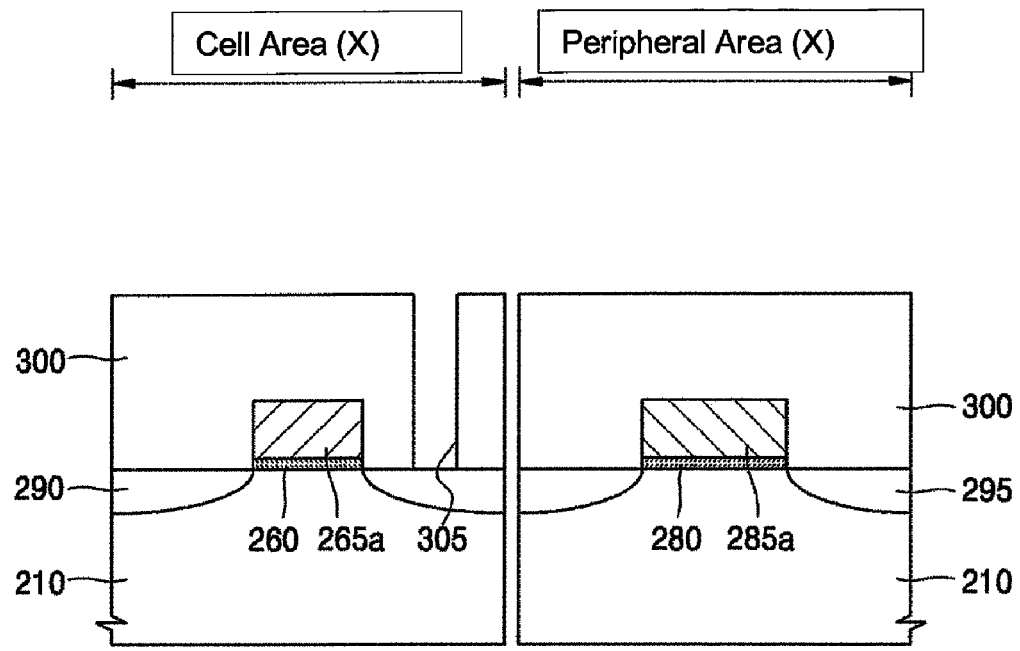
Figure 29B:
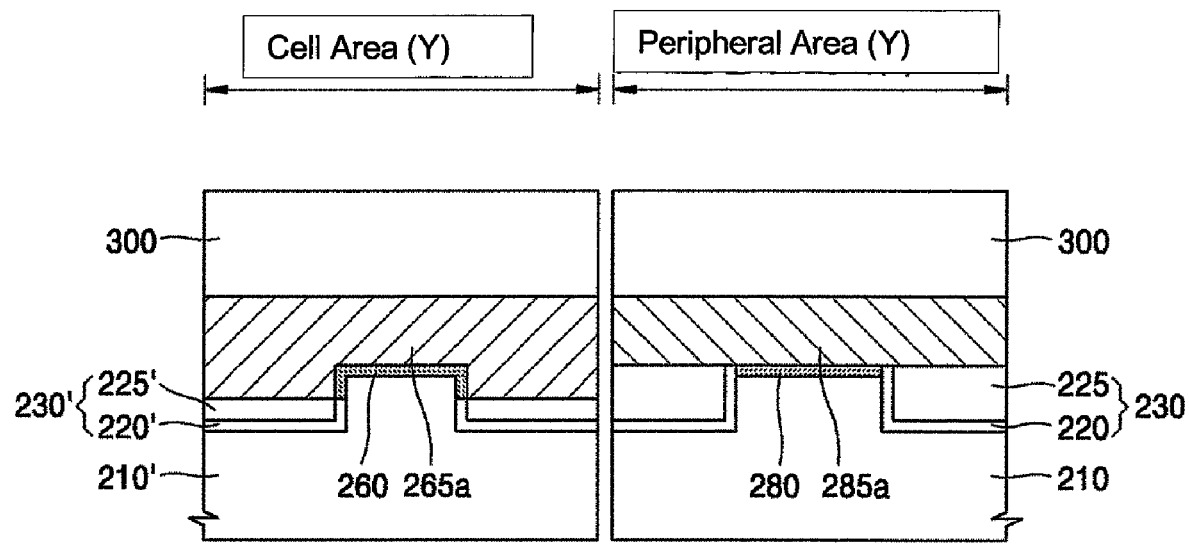

Referring to FIGS. 29A and 29B, an interlayer insulating layer 300 is formed on the entire surface of the semiconductor substrate 210, and thereafter, a through-hole 305 is formed to expose one of the first source/drain regions 290.

Figure 30A:
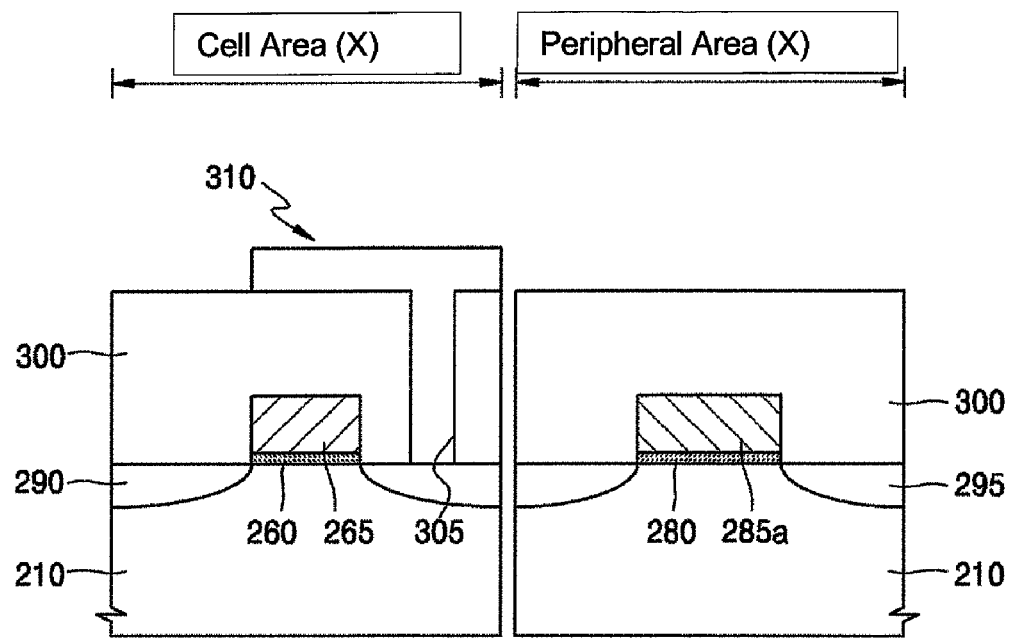
Figure 30B:
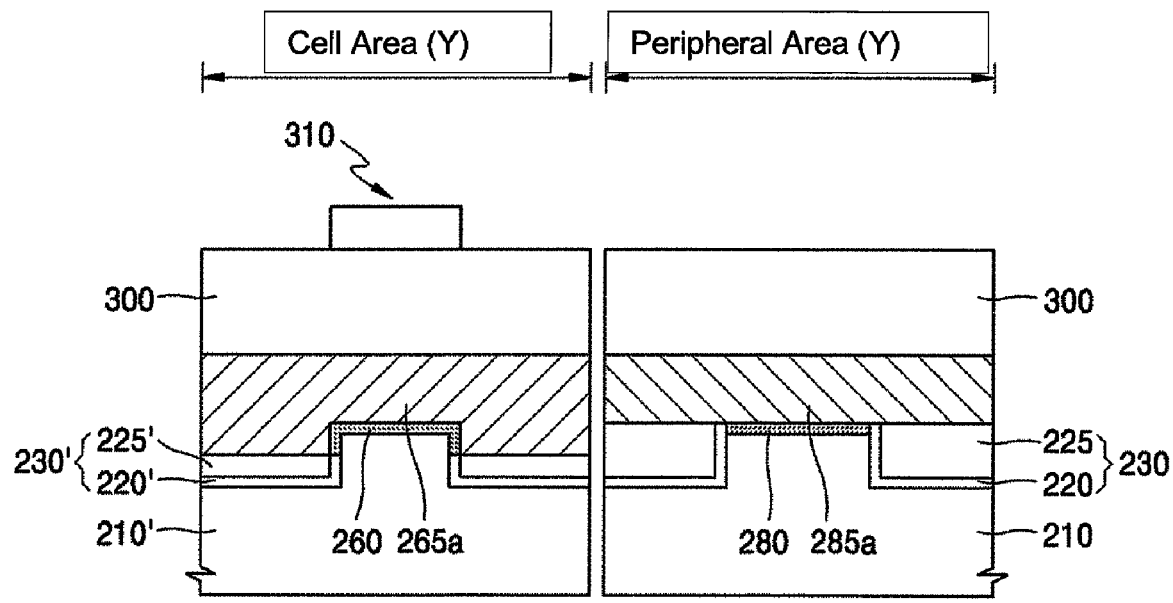

Referring to FIGS. 30A and 30B, SEG of silicon is performed at the surface portion of the first source/drain region 290 exposed through the hole 305, to thereby form a silicon layer which fills the through-hole 305 and which extends over the interlayer insulating layer 300. Then, the silicon layer is patterned to form a second active region 310 having a fin shape configuration.

Figure 31A:
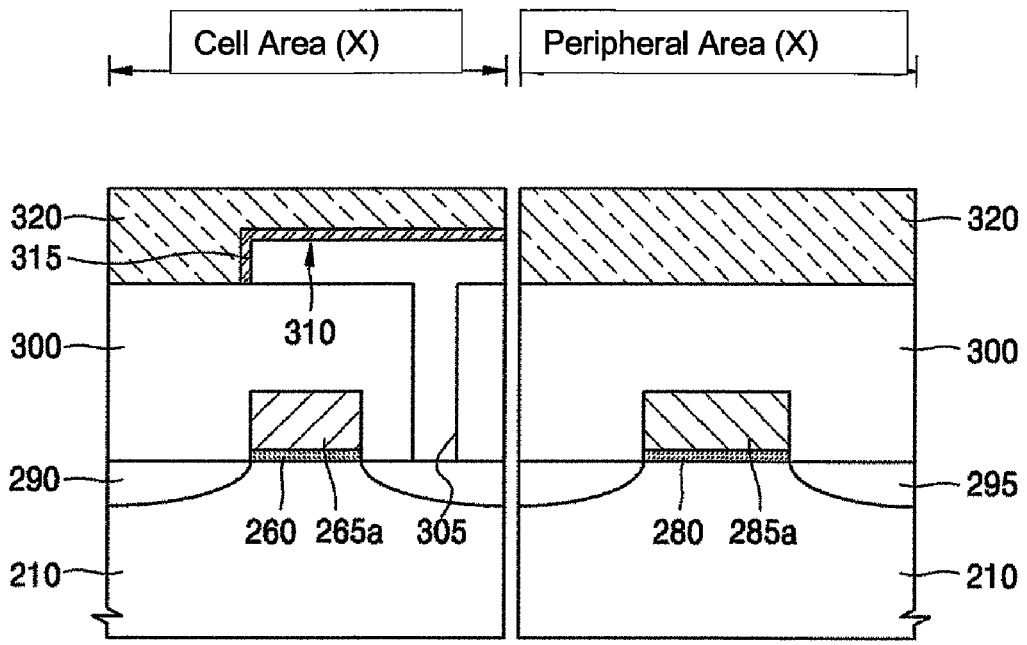
Figure 31B:
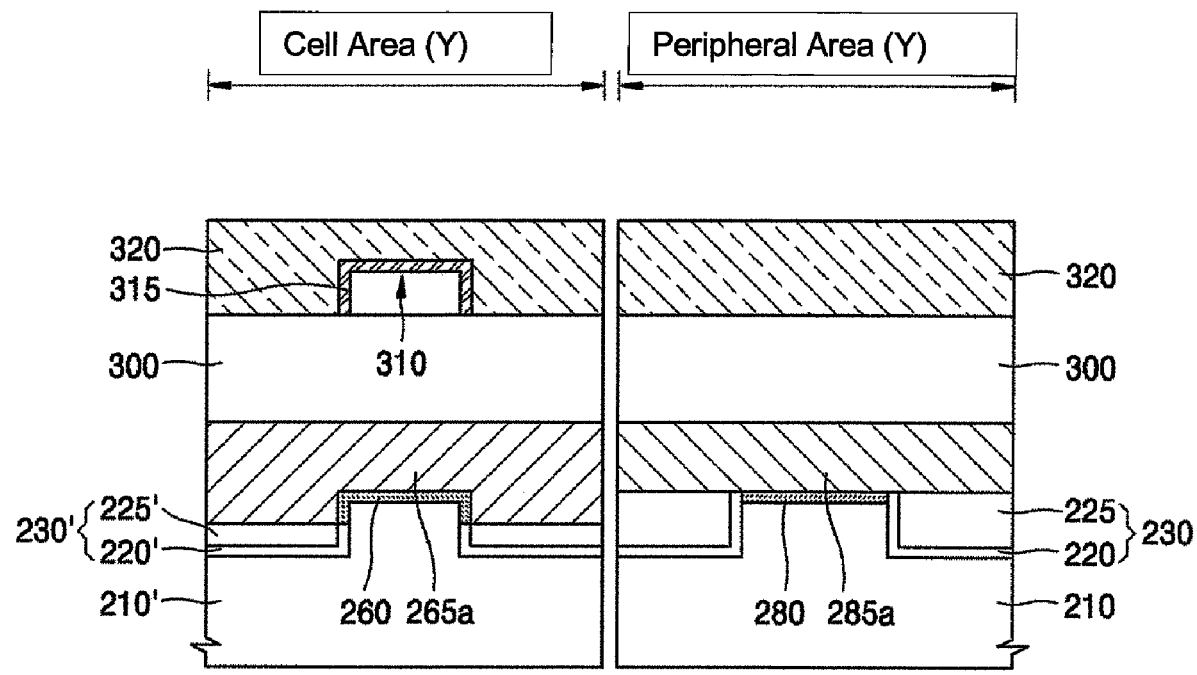

Referring next to FIGS. 31A and 31B, a second gate oxide layer 315 is formed on the second active region 310. The second gate oxide layer 315 may, for example, be a silicon oxide layer that is grown by thermal oxidation. Next, a second gate conductive layer 320 is formed. The second gate conductive layer 320 may, for example, be formed of an undoped polysilicon layer.

Figure 32A:
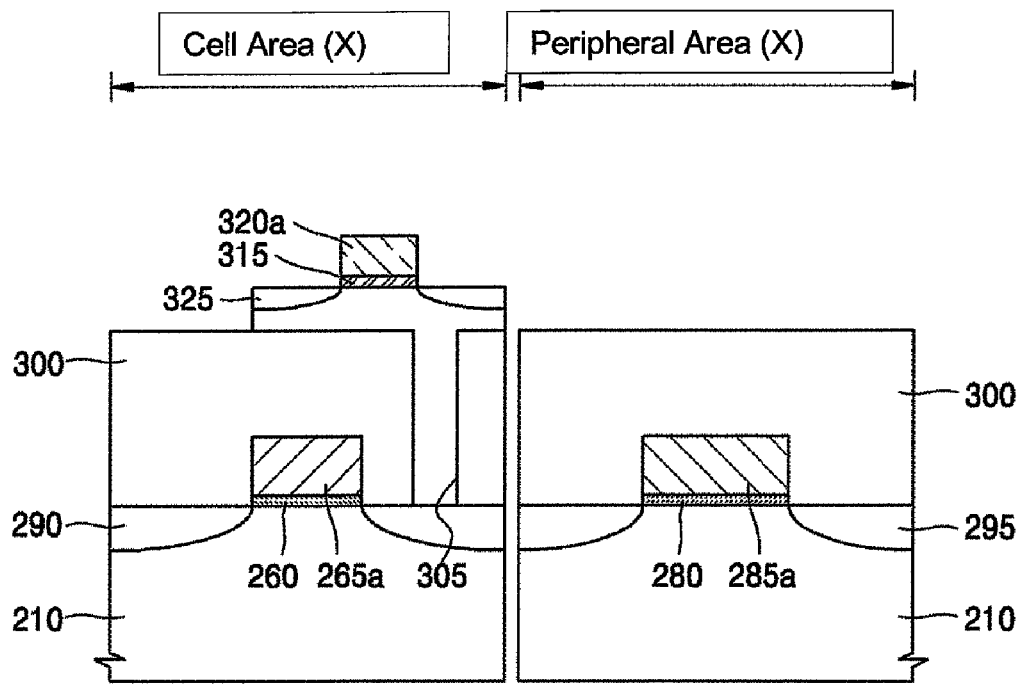
Figure 32B:
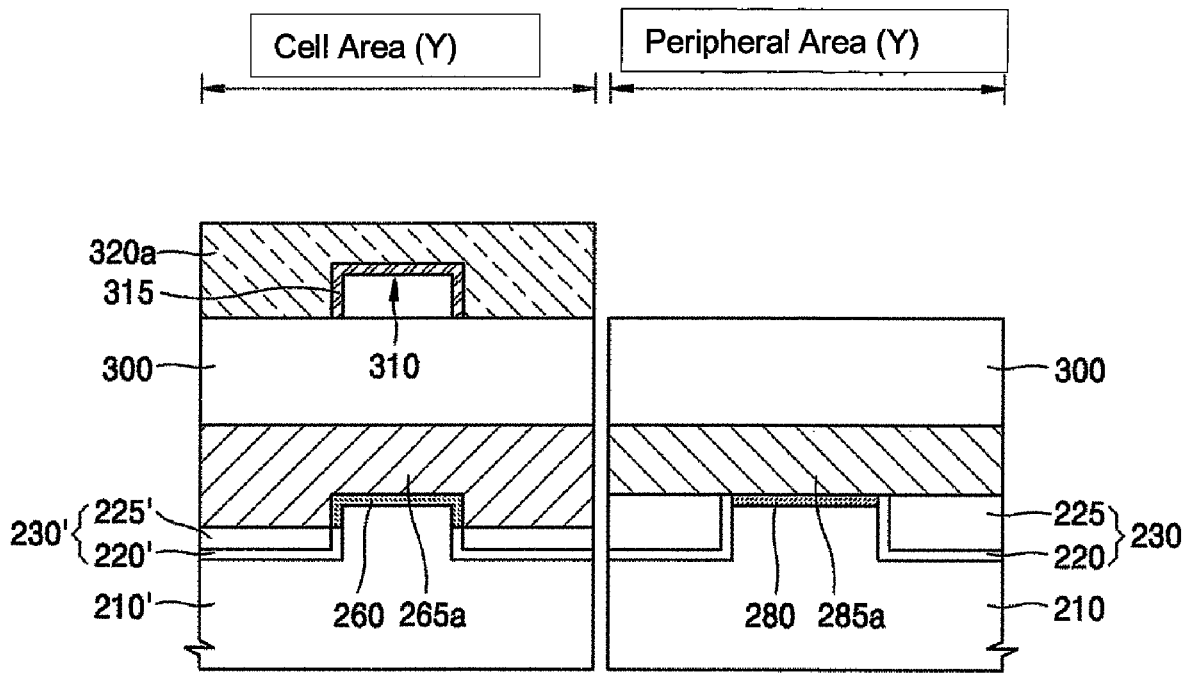

Referring to FIGS. 32A and 32B, the second gate conductive layer 320 is patterned to form a second gate electrode 320a. Subsequently, ion-implantation is performed to optionally achieve gate doping and to form second source/drain regions 325. The second source/drain regions 325 may be formed of an LDD structure. In this case, additional processes of forming spacers at side walls of the second gate electrode 320a and conducting an additional ion implantation are needed.

As shown in FIGS. 32A and 32B, a semiconductor device according to the third embodiment of the present invention includes a first and second conductivity type FinFETs stacked in a cell area, and a MOSFET formed in a peripheral circuit area. The first conductivity type FinFET includes the first gate oxide layer 260, the first gate electrode 265a, and the first source/drain regions 290, all formed at the first active region 235. The interlayer insulating layer 300 is formed on the first conductivity type FinFET, and the second active region 310 penetrates the interlayer insulating layer 300 to connect with one of the first source/drain regions 290 and extends over the interlayer insulating layer 300. The second conductivity type FinFET including the second gate oxide layer 315, the second gate electrode 320a, and the second source/drain regions 325, all formed at the second active region 310.

Since the first conductivity type FinFET is formed, in this example, using a damascene method, the surface of the isolation layer 230' is lower than the upper surface of the semiconductor substrate 210, and the first active region 235 forms the fin 235' which extends above the surface of the isolation layer 230'. The first gate oxide layer 260 is formed along the surface of the fin 235'. The first gate electrode 265a has a generally flat top surface and surrounds the fin 235'. The second active region 300 is a silicon layer obtained by SEG from the surface of one of the first source/drain regions 290.

The MOSFET includes the MOSFET gate oxide layer 280, the MOSFET gate electrode 285a, and the MOSFET source/drain regions 295, all formed in the peripheral circuit area.

When a plurality of FinFETs of different conductivity types are to be formed in the cell area, it is preferred that all of the FinFETs formed in a lower layer have a first conductivity type, while all of the FinFETs formed in an upper layer have a second conductivity type. For example, when an SRAM cell is constructed of n-type FinFETs and p-type FinFETs as mentioned previously, it is preferred that the n-type FinFETs all be formed in one layer, and the p-type FinFETs all be formed in another layer.

Vertical stacking of the FinFETs increases the integration density of the semiconductor device. Also, since the gate conductive layers of the different conductivity type FinFETs are not contained in the same layer, and since the MOSFET is contained in the peripheral circuit area, it is possible to tailor the fabrication of each type of gate conductive layer in a manner best suited the characteristics of the conductivity type of each gate conductive layer. While the present invention has been particularly shown and described with reference to exemplary embodiments thereof, it will be understood by those of ordinary skill in the art that various changes in form and details may be made therein without departing from the spirit and scope of the present invention. For example, in the above-described embodiments, two conductivity types of FinFETs are formed in two layers, i.e., a lower layer and an upper layer, respectively. However, additional FinFETs contained in additional layers may also be provided. For example, a second insulating layer formed over the second FinFET device of the second conductivity type, and a third FinFET device of the first conductivity may be located over the second insulating layer and have a third gate electrode extending over a top surface and opposite side surfaces of a third active region, where the third active region of the third FinFET device is connected to a source/drain region of the second FinFET device via an opening in the second insulating layer. Again, the scope of the present invention is not limited by the disclosed embodiments, and instead is defined by the claims that follow.

What is claimed is:

1. A semiconductor device, comprising:
    a semiconductor substrate;
    a first FET device of a first conductivity located over the semiconductor substrate and having a first gate electrode extending over a top surface and opposite side surfaces of a first active region;
    an insulating layer formed over the first FET device; and
    a second FET device of a second conductivity located over the insulating layer and having a second gate electrode extending over a top surface and opposite side surfaces of a second active region.

2. The semiconductor device of claim 1, wherein the first and second FET devices are FinFET devices.

3. The semiconductor device of claim 2, wherein the second active region of the second FET device is connected to a source/drain region of the first FET device via an opening in the insulating layer.

4. The semiconductor device of claim 2, wherein a material of the first gate electrode is different than a material of the second gate electrode.

5. The semiconductor device of claim 4, wherein the first gate electrode comprises N+ doped polysilicon.

6. The semiconductor device of claim 4, wherein the first gate electrode comprises SiGe.

7. The semiconductor device of claim 5, wherein the second gate electrode comprises P+ doped polysilicon.

8. The semiconductor device of claim 4, wherein the second gate electrode comprises P+ doped polysilicon.

9. The semiconductor device of claim 2, further comprising:
    a second insulating layer formed over the second FET device; and
    a third FinFET device of the first conductivity located over the second insulating layer and having a third gate electrode extending over a top surface and opposite side surfaces of a third active region, wherein the third active region of the third FinFET device is connected to a source/drain region of the second FET device via an opening in the second insulating layer.

10. The semiconductor device of claim 9, wherein a material of first FinFET gate electrode is different than a material of each of the second and third gate electrodes.

11. The semiconductor device of claim 10, wherein the material of the second gate electrode is different than the material of the third gate electrode.

12. A semiconductor device, comprising:
  a semiconductor substrate having a cell area and a peripheral circuit area;
  a first FET device of a first conductivity located in the cell area over the semiconductor substrate and having a first gate electrode extending over a top surface and opposite side surfaces of a first active region;
  a MOSFET device located over the peripheral circuit area and having a second gate electrode;
  an insulating layer formed over the first FET device and the MOSFET device; and
  a second FET device of a second conductivity located over the insulating layer and stacked over the first FET device, the second FET device having second gate electrode extending over a top surface and opposite side surfaces of a second active region.

13. The semiconductor device of claim 12, wherein the first and second FET device are FinFET devices.

14. The semiconductor device of claim 13, wherein the second active region of the second FinFET device is connected to a source/drain region of the first FinFET device via an opening in the insulating layer.

15. The semiconductor device of claim 13, wherein a material of the first gate electrode is different than a material of the second gate electrode.

16. The semiconductor device of claim 13, wherein respective materials of the first, second and third gate electrodes are different from one another.

* * * * *